United States Patent
Kim et al.

(10) Patent No.: US 9,748,489 B2
(45) Date of Patent: Aug. 29, 2017

(54) COPOLYMER AND ORGANIC SOLAR CELL COMPRISING SAME

(71) Applicant: LG CHEM, LTD., Seoul (KR)

(72) Inventors: Jinseck Kim, Daejeon (KR); Jaechol Lee, Daejeon (KR); Jaesoon Bae, Daejeon (KR); Jiyoung Lee, Daejeon (KR); Keun Cho, Daejeon (KR); Doo Whan Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/905,242

(22) PCT Filed: Jun. 19, 2014

(86) PCT No.: PCT/KR2014/005393
§ 371 (c)(1),
(2) Date: Jan. 14, 2016

(87) PCT Pub. No.: WO2015/008939
PCT Pub. Date: Jan. 22, 2015

(65) Prior Publication Data
US 2016/0155947 A1    Jun. 2, 2016

(30) Foreign Application Priority Data
Jul. 15, 2013    (KR) .................. 10-2013-0082942

(51) Int. Cl.
*C08G 75/00*    (2006.01)
*H01L 51/00*    (2006.01)
(Continued)

(52) U.S. Cl.
CPC ........ *H01L 51/0036* (2013.01); *C08G 61/126* (2013.01); *C08G 75/00* (2013.01); *C08G 75/32* (2013.01); *C08L 65/00* (2013.01); *H01L 51/0043* (2013.01); *C08G 2261/122* (2013.01); *C08G 2261/148* (2013.01); *C08G 2261/1412* (2013.01); *C08G 2261/1424* (2013.01); *C08G 2261/3223* (2013.01); *C08G 2261/3241* (2013.01); *C08G 2261/3243* (2013.01);
(Continued)

(58) Field of Classification Search
CPC .... H01L 51/0036; C08G 75/32; C08G 61/126
See application file for complete search history.

(56) References Cited

U.S. PATENT DOCUMENTS

2010/0307594 A1    12/2010    Zhu et al.
2011/0006287 A1    1/2011    You et al.
(Continued)

FOREIGN PATENT DOCUMENTS

EP    2692760 A1    2/2014
JP    2012-527784 A    11/2012
(Continued)

OTHER PUBLICATIONS

Helgesen et al. (Chem. Mater. 2009, 21, 4669-4675).*
(Continued)

*Primary Examiner* — Shane Fang
(74) *Attorney, Agent, or Firm* — Dentons US LLP

(57) ABSTRACT

The present specification provides a copolymer and an organic solar cell including the same.

20 Claims, 2 Drawing Sheets

(51) Int. Cl.
*C08L 65/00* (2006.01)
*C08G 61/12* (2006.01)
*C08G 75/32* (2006.01)
*H01L 51/42* (2006.01)
*C08K 7/24* (2006.01)
*C08K 3/04* (2006.01)

(52) U.S. Cl.
CPC ........ *C08G 2261/3246* (2013.01); *C08G 2261/344* (2013.01); *C08G 2261/364* (2013.01); *C08G 2261/414* (2013.01); *C08G 2261/91* (2013.01); *C08K 7/24* (2013.01); *C08K 2003/045* (2013.01); *H01L 51/424* (2013.01); *H01L 51/4253* (2013.01); *Y02E 10/549* (2013.01)

(56) References Cited

U.S. PATENT DOCUMENTS

| | | |
|---|---|---|
| 2012/0186652 A1 | 7/2012 | Pan et al. |
| 2013/0048075 A1 | 2/2013 | Leclerc et al. |
| 2013/0056072 A1 | 3/2013 | Park et al. |
| 2013/0056073 A1 | 3/2013 | Kim et al. |

FOREIGN PATENT DOCUMENTS

| | | |
|---|---|---|
| JP | 2014-501032 A | 1/2014 |
| KR | 2013-0016130 A | 2/2013 |
| KR | 2013-0016132 A | 2/2013 |
| TW | 201105701 A | 2/2011 |
| WO | 2010/135701 A1 | 11/2010 |
| WO | 2012/054910 A1 | 4/2012 |
| WO | 2012/133793 A1 | 10/2012 |
| WO | 2014/202184 A1 | 12/2014 |

OTHER PUBLICATIONS

Price, S. C. et al., Low Band Gap Polymers Based on Benzo[1,2-b:4,5-b']dithiophene: Rational Design of Polymers Leads to High Photovoltaic Performance, Macromolecules, Apr. 23, 2010, vol. 43 (10), pp. 4609-4612.

Jian-Ming Jiang et al., Conjugated random copolymers of benzodithiophene—benzooxadiazole—diketopyrrolopyrrole with full visible light absorption for bulk heterojunction solar cells, Polymer Chemistry. The RSC. 2013, 4, pp. 5321-5328.

Najari, et al.: "Synthesis and Characterization of New Thieno[3,4-c]pyrrole-4,6-dione Derivatives for Photovoltaic Applications", XP-001560459, Advanced Functional Materials, vol. 21, No. 4, Feb. 22, 2011, pp. 718-728.

* cited by examiner

[Figure 1]
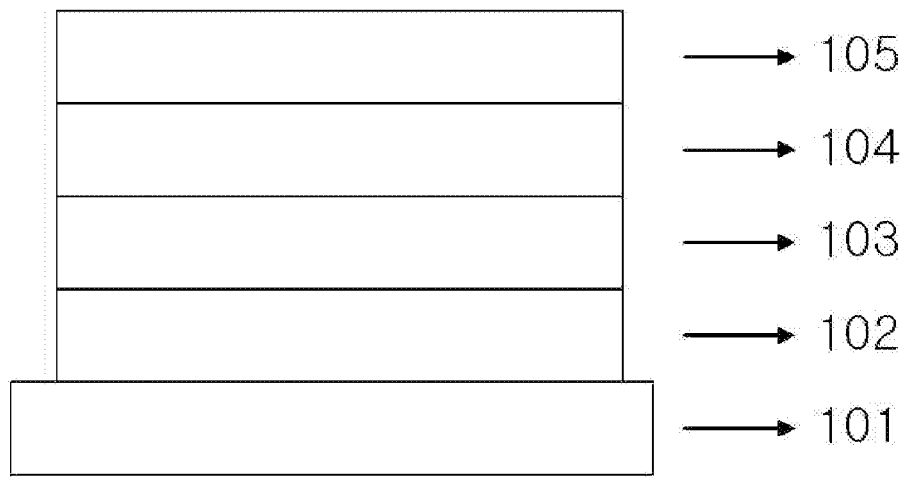
[Figure 2]
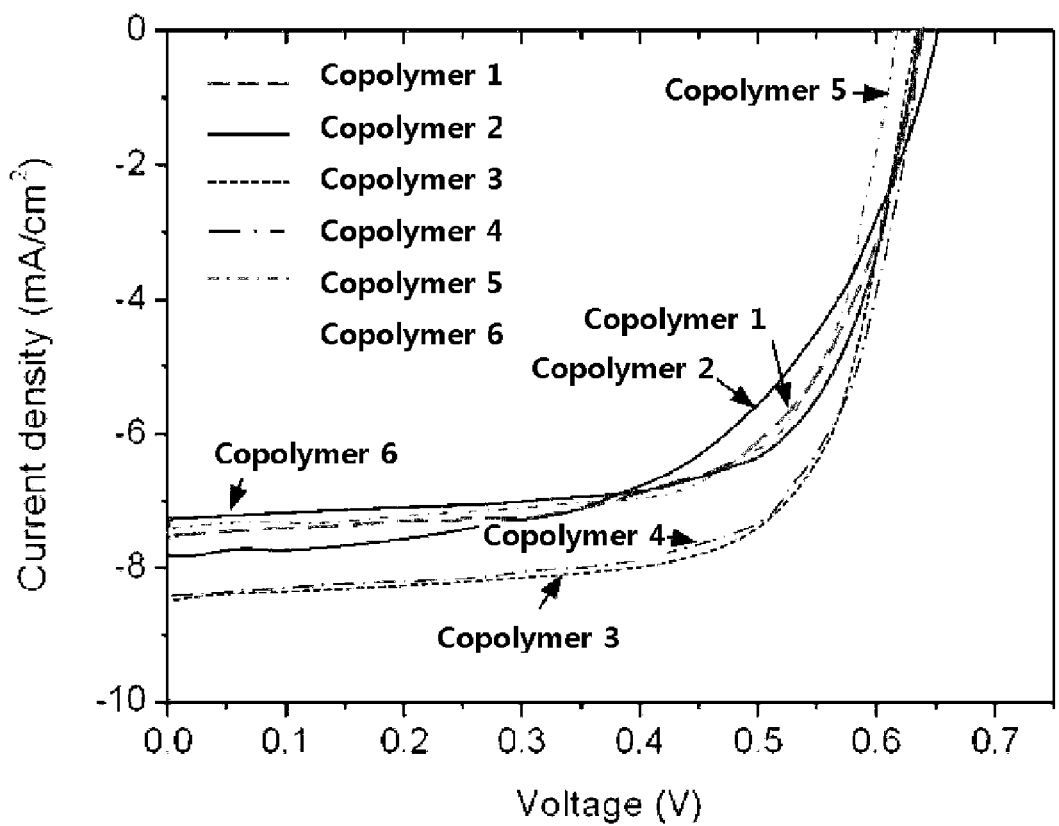

[Figure 3]
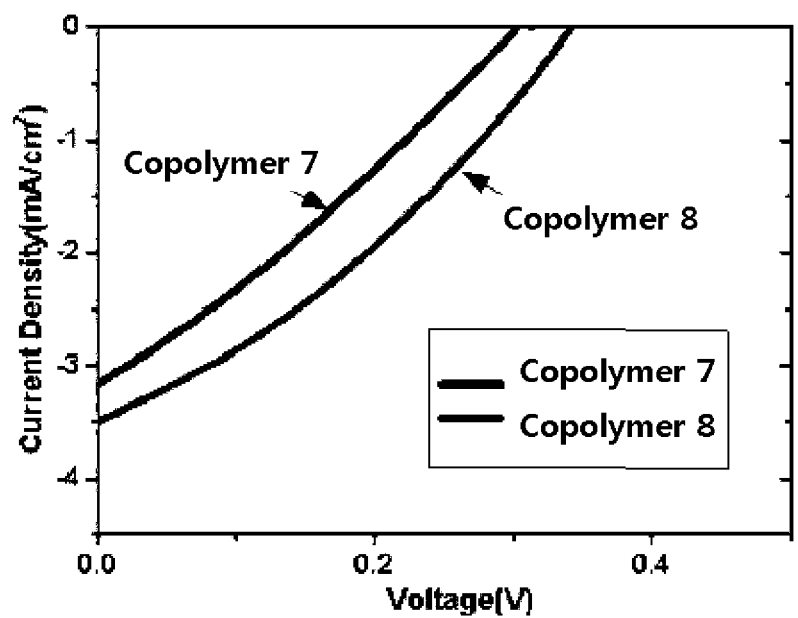

COPOLYMER AND ORGANIC SOLAR CELL COMPRISING SAME

CROSS-REFERENCE

This application is a National Stage Application of International Application No. PCT/KR2014/005393, filed Jun. 19, 2014, and claims priority to and the benefit of Korean Patent Application No. 10-2013-0082942, filed on Jul. 15, 2013, the contents of each which is incorporated by reference in its entirety for all purposes as if fully set forth below.

TECHNICAL FIELD

The present specification relates to a copolymer and an organic solar cell including the same.

This application claims priority to and the benefit of Korean Patent Application No. 10-2013-0082942, filed in the Korean Intellectual Property Office on Jul. 15, 2013, the contents of which are incorporated herein by reference.

BACKGROUND ART

An organic solar cell is a device that may directly convert solar energy into electrical energy by applying a photovoltaic effect. A solar cell may be classified into an inorganic solar cell and an organic solar cell depending on a material constituting a thin film. A typical solar cell is manufactured with p-n junction obtained by doping crystalline silicon (Si), which is an inorganic semiconductor. Electrons and holes generated due to absorption of light diffuse to a p-n junction point, and are accelerated by an electric field and moved to an electrode. A power conversion efficiency of this procedure is defined as a ratio of a power given in an external circuit to a solar power fed into the solar cell, and reaches up to 24% when measured under the virtual solar irradiation conditions currently standardized. However, since the inorganic solar cell in the related art already has limits in economic feasibility and available materials, an organic semiconductor solar cell, which is easily processed and cheap and has various functionalities is in the spotlight as a long-term alternative energy source.

In the solar cell, it is important to increase the efficiency such that electrical energy as much as possible may be outputted from the solar energy. In order to increase the efficiency of the solar cell, it is also important to generate excitons as much as possible from inside the semiconductor, but it is also important to take out electric charges generated to the outside without being lost. One of the causes that electric charges are lost is that generated electrons and holes are annihilated by means of recombination. As a method of transferring generated electrons or holes to an electrode without being lost, various methods have been suggested, but most of the methods required additional processes, and as a result, manufacturing costs may be increased.

DETAILED DESCRIPTION OF THE INVENTION

Technical Problem

An object of the present specification is to provide a copolymer and an organic solar cell including the same.

Technical Solution

An exemplary embodiment of the present specification provides a copolymer including a first unit represented by the following Formula 1; and a second unit represented by the following Formula 2.

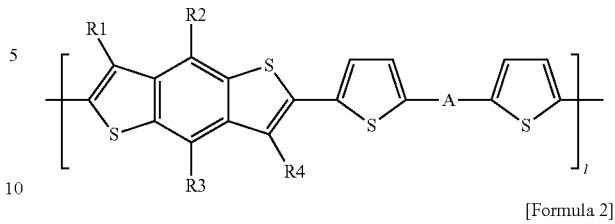

[Formula 1]

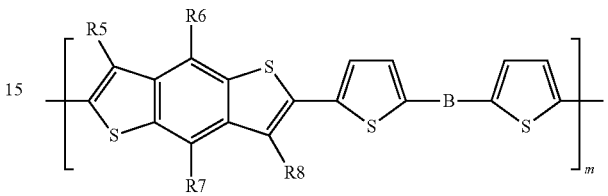

[Formula 2]

in Formulae 1 and 2, l is a real number, which is 0<l<1 as a mole fraction, m is a real number, which is 0<m<1 as a mole fraction, and l+m=1, A and B are different from each other, and include one or more selected from the group consisting of a direct bond; a monocyclic or polycyclic substituted or unsubstituted divalent heterocyclic group; a monocyclic or polycyclic substituted or unsubstituted divalent aromatic cyclic group; and a fused divalent ring in which a monocyclic or polycyclic heterocyclic group and a monocyclic or polycyclic aromatic cyclic group are substituted or unsubstituted, and R1 to R8 are the same as or different from each other, and are each independently selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

An exemplary embodiment of the present specification provides an organic solar cell including a first electrode; a second electrode provided opposite to the first electrode; and an organic material layer having one or more layers disposed between the first electrode and the second electrode and including a photoactive layer, in which one or more layers of the organic material layer include the copolymer.

Advantageous Effects

The copolymer of the present specification may be used as a material for an organic material layer of an organic solar cell, and the organic solar cell including the same may exhibit excellent characteristics in an increase in an open-circuit voltage and a short-circuit current and/or an increase in efficiency.

Further, the planarity and solubility of the polymer may be arbitrarily adjusted by adjusting the ratio of a first unit and a second unit, which have different solubilities, thereby manufacturing a high efficiency organic solar cell.

In particular, the copolymer according to an exemplary embodiment of the present specification has a deep HOMO level, a small bandgap, and a high charge mobility, and thus may exhibit excellent characteristics. The polymer according to an exemplary embodiment of the present specification may be used alone or in a mixture with other materials, enhance efficiency of a device, and enhance life-span characteristics of the device by means of thermal stability of the compound.

BRIEF DESCRIPTION OF DRAWINGS

FIG. 1 is a view illustrating an organic solar cell according to an exemplary embodiment of the present specification.

FIG. 2 is a view illustrating a current-voltage curve of organic solar cells of Preparation Examples 1 to 6 of the present specification.

FIG. 3 is a view illustrating a current-voltage curve of organic solar cells of Comparative Examples 1 to 2 of the present specification.

BEST MODE

Hereinafter, the present specification will be described in detail.

The term 'unit' as used herein means a repeated structure which is included in a monomer of a copolymer, in which the monomer is bonded to the copolymer by means of polymerization.

The term 'including a unit' as used herein means being included in a main chain in the copolymer.

An exemplary embodiment of the present specification provides a copolymer including the first unit represented by Formula 1 and the second unit represented by Formula 2.

The first unit and the second unit according to an exemplary embodiment of the present specification include an unsubstituted thiophene group. In this case, it is possible to prevent steric hindrance with benzodithiophene having a bulk structure positioned next to the thiophene of the first unit and the second unit, and prevent the structure of the main chain from being tilted.

In an exemplary embodiment of the present specification, the units of A and B are different from each other.

In an exemplary embodiment of the present specification, A and B are different from each other, and one of the following Formulae.

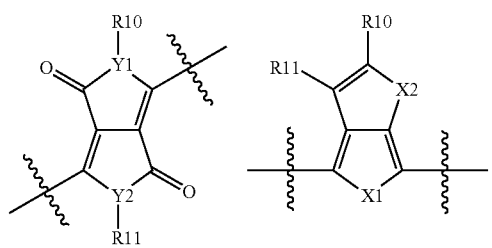

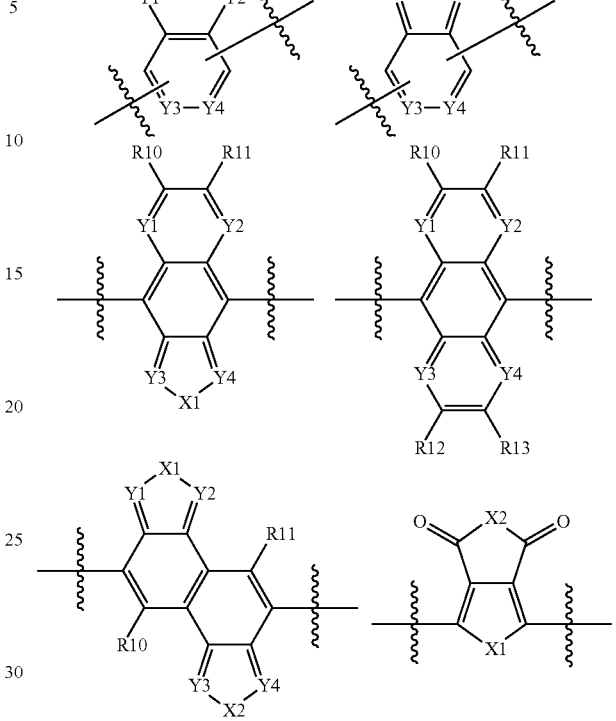

X1 and X2 are the same as or different from each other, and are each independently selected from the group consisting of CRR', NR, O, SiRR', PR, S, GeRR', Se, and Te, Y1 to Y4 are the same as or different from each other, and are each independently selected from the group consisting of CR, N, SiR, P, and GeR, R10 to R13 and R and R' are the same as or different from each other, and are each independently selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

Examples of the substituents will be described below, but are not limited thereto.

In the present specification,

means a moiety bonded to the main chain of the copolymer, or a moiety bonded to another substituent.

The term "substituted or unsubstituted" as used herein means being substituted with one or more substituents selected from the group consisting of deuterium; a halogen group; an alkyl group; an alkenyl group; an alkoxy group; a cycloalkyl group; a silyl group; an arylalkenyl group; an aryloxy group; an alkylthioxy group; an alkylsulfoxy group; an arylsulfoxy group; a boron group; an alkylamine group; an aralkylamine group; an arylamine group; a heteroaryl group; a carbazole group; an arylamine group; an aryl group; a nitrile group; a nitro group; a hydroxyl group; and a heterocyclic group, or having no substituent.

In the present specification, examples of a halogen group include fluorine, chlorine, bromine, or iodine.

In the present specification, the carbon number of the imide group is not particularly limited, but is preferably 1 to 25. Specifically, the imide group may be compounds having the following structures, but is not limited thereto.

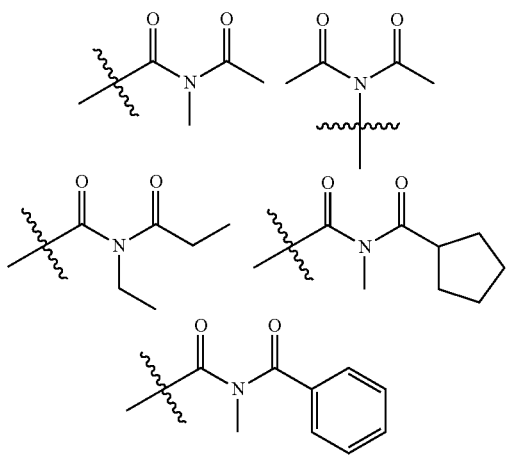

In the present specification, one or two nitrogen atoms of the amide group may be substituted with hydrogen, a straight-chain, branched-chain, or cyclic alkyl group having 1 to 25 carbon atoms, or an aryl group having 6 to carbon atoms. Specifically, the amide group may be compounds having the following Structural Formulae, but is not limited thereto.

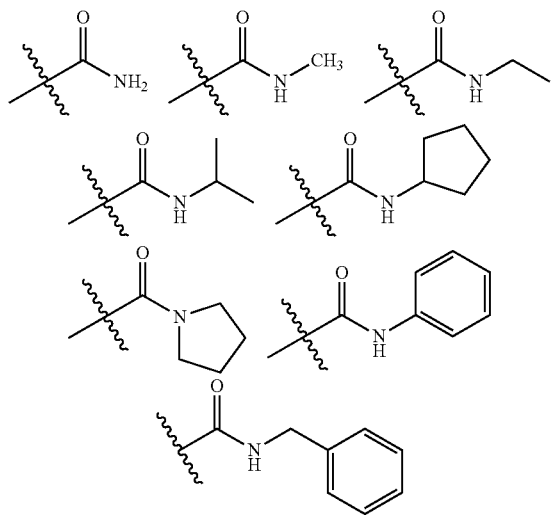

In the present specification, the alkyl group may be a straight-chain or branched-chain, and the carbon number thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohectylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the cycloalkyl group is not particularly limited, but is preferably a cycloalkyl group having 3 to 60 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chain, branched-chain, or cyclic. The carbon number of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight chain or branched chain, and the carbon number thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto. In the present specification, the aryl group may be a monocyclic aryl group or a polycyclic aryl group. In addition, the aryl group in the present specification may mean an aromatic ring.

When the aryl group is the monocyclic aryl group, the carbon number thereof is not particularly limited, but is preferably 6 to 25. Specific examples of the monocyclic aryl group include a phenyl group, a biphenyl group, a terphenyl group, and the like, but are not limited thereto.

When the aryl group is a polycyclic aryl group, the carbon number thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and two substituents may be combined with each other to form a spiro structure.

When the fluorenyl group is substituted, the fluorenyl group may be

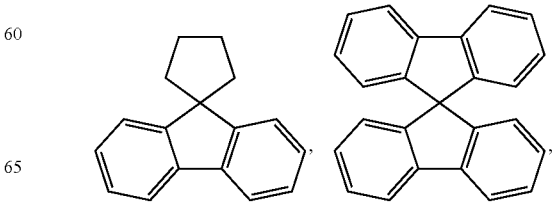

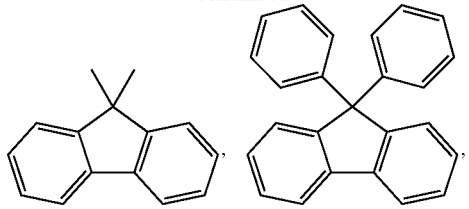

and the like. However, the constitution is not limited thereto.

In the present specification, specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, specific examples of the boron group include a trimethylboron group, a triethylboron group, a t-butyldimethylboron group, a triphenylboron group, a phenylboron group, and the like, but are not limited thereto.

In the present specification, the carbon number of the amine group is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

In the present specification, examples of the arylamine group include a substituted or unsubstituted monoarylamine group, a substituted or unsubstituted diarylamine group, or a substituted or unsubstituted triarylamine group. An aryl group in the arylamine group may be a monocyclic aryl group, or a polycyclic aryl group. Two or more arylamine groups which the aryl group includes may include a monocyclic aryl group, a polycyclic aryl group, or both a monocyclic aryl group and a polycyclic aryl group.

Specific examples of the arylamine group include a phenylamine group, a naphthylamine group, a biphenylamine group, an anthracenylamine group, a 3-methyl-phenylamine group, a 4-methyl-naphthylamine group, a 2-methyl-biphenylamine group, a 9-methyl-anthracenylamine group, a diphenylamine group, a phenylnaphthylamine group, a ditolylamine group, a phenyltolylamine group, a carbazole group, a triphenylamine group, and the like, but are not limited thereto.

In the present specification, the heterocyclic group is a heterocyclic group having one or more heteroatoms instead of carbon, and the carbon number thereof is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyrido-pyrimidinyl group, a pyrido-pyrazinyl group, a pyrazino pyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present application, the aryl group in the aryloxy group, the arylthioxy group, the arylsulfoxy group, and the aralkylamine group is the same as the aforementioned examples of the aryl group. Specific examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but are not limited thereto.

The heteroatom may be one or more of N, O, and S, but is not limited thereto.

In the present application, the heteroaryl group in the heteroarylamine group may be selected from the aforementioned examples of the heterocyclic group.

In the present specification, the alkyl group in the alkylamine group, the alkylthioxy group, the alkylsulfoxy group, and the like is the same as the aforementioned examples of the alkyl group. Specific examples of the alkylthioxy group include a methylthioxy group, an ethylthioxy group, a tert-butylthioxy group, a hexylthioxy group, an octylthioxy group, and the like, but examples of the alkylsulfoxy group include a methylsulfoxy group, an ethylsulfoxy group, a propylsulfoxy group, a butylsulfoxy group, and the like, but are not limited thereto.

In the present specification, the meaning that two adjacent substituents are combined with each other to form a ring means that adjacent groups are combined with each other to form a substituted or unsubstituted aliphatic hydrocarbon ring; a substituted or unsubstituted aromatic hydrocarbon ring; a substituted or unsubstituted aliphatic heterocyclic ring; or a substituted or unsubstituted aromatic heterocyclic ring.

In the present specification, the aliphatic hydrocarbon ring means a ring composed only of carbon and hydrogen atoms as a ring which is not aromatic.

In the present specification, examples of the aromatic hydrocarbon ring include a phenyl group, a naphthyl group, an anthracenyl group, and the like, but are not limited thereto.

In the present specification, the aliphatic heterocyclic ring means an aliphatic ring including one or more heteroatoms instead of carbon. In the present specification, the aromatic heterocyclic ring means an aromatic ring including one or more heteroatoms instead of carbon.

In the present specification, the aliphatic hydrocarbon ring, the aromatic hydrocarbon ring, the aliphatic heterocyclic ring, and the aromatic heterocyclic ring may be monocyclic or polycyclic.

In an exemplary embodiment of the present specification, the solubility of the second unit is larger than that of the first unit.

Specifically, in an exemplary embodiment of the present specification, the solubility of the second unit is 2 to 10 times larger than that of the first unit. In this case, the solubility of a final copolymer may be arbitrarily adjusted by adjusting the ratio of the first unit and the second unit.

The term "solubility of the unit" as used herein means measurement of the solubility in a solution of each unit monomer at room temperature.

However, in an exemplary embodiment of the present specification, a value of the solubility may be embodied, but embodied solubility value conditions in all the solutions need not be satisfied, and it is sufficient to satisfy solubility value conditions in selected one or two or more solutions.

In an exemplary embodiment of the present specification, the solution is one or two or more selected from the group consisting of chlorinated solvent, toluene, xylenes, trimethylbenzenes, and tetrahydrofuran.

Examples of the trimethylbenzenes include 1,2,4-trimethylbenzene, 1,2,3-trimethylbenzen, and the like, but are not limited thereto.

In an exemplary embodiment of the present specification, the solubility in a chlorobenzene solution means solubility measured at room temperature conditions.

Examples of the chlorinated solvent in the present specification include chloroform, 1,2-dichlorobenzene, tetrachloroethane, and the like, but are not limited thereto.

In an exemplary embodiment of the present specification, the solubility of the second unit in a solution selected from the group consisting of a chlorinated solvent, toluene, xylenes, trimethylbenzenes, and tetrahydrofuran (THF) is 2 to 10 times larger than the solubility of the first unit in a solution selected from the group consisting of a chlorinated solvent, toluene, xylenes, trimethylbenzenes, and tetrahydrofuran (THF).

In an exemplary embodiment of the present specification, the solubility of the second unit in a chlorobenzene solution is 2 to 10 times larger than that of the first unit in a chlorobenzene solution.

According to an exemplary embodiment of the present specification, by adjusting the ratio of l and m which are a mole fraction of the first unit and the second unit, which have different solubilities, the planarity and/or solubility of the copolymer may be adjusted, and a high efficiency organic solar cell may be manufactured.

According to an exemplary embodiment of the present specification, the solubility of a copolymer including the first unit and the second unit in a solution selected from the group consisting of a chlorinated solvent, toluene, xylenes, trimethylbenzenes, and tetrahydrofuran is 1 mg/ml to 200 mg/ml at room temperature.

In an exemplary embodiment of the present specification, the solubility of a copolymer including the first unit and the second unit in a chlorobenzene solution is 1 mg/ml to 200 mg/ml at room temperature.

In an exemplary embodiment of the present specification, the ratio of the first unit and the second unit is 1:4 to 4:1.

In an exemplary embodiment of the present specification, the ratio of the first unit and the second unit is 1:1.

In an exemplary embodiment of the present specification, the solubility of the first unit and the second unit may be made different by adjusting A and B, or adjusting the substituent of R1 to R4 and R5 to R8.

In an exemplary embodiment of the present specification, the solubility of the first unit and the second unit may be adjusted by making A and B different from each other. The making of A and B different from each other may be adjusted by making A and B which are the main chain of the polymer different or making the substituent of A and B which correspond to the side chain of the polymer.

In an exemplary embodiment of the present specification, B includes at least one substituent which increases a solubility at the side chain.

In another exemplary embodiment, B includes at least one of a substituted or unsubstituted alkyl group having 1 to 40 carbon atoms, a substituted or unsubstituted alkoxy group having 1 to 40 carbon atoms, a substituted or unsubstituted sulfide group having 1 to 40 carbon atoms, and a hydroxyl group at the side chain.

In an exemplary embodiment of the present specification, A is

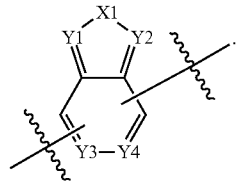

In an exemplary embodiment of the present specification, X1 is S.

In an exemplary embodiment of the present specification, Y1 is N.

In an exemplary embodiment of the present specification, Y2 is N.

In an exemplary embodiment of the present specification, Y3 is CR.

In an exemplary embodiment of the present specification, Y4 is CR.

In an exemplary embodiment of the present specification, R is hydrogen.

In an exemplary embodiment of the present specification, A is

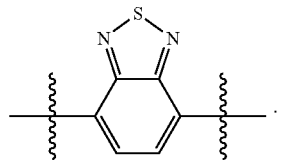 [SMILES: *c1ccc(*)c2nsnc12]

In an exemplary embodiment of the present specification, A is

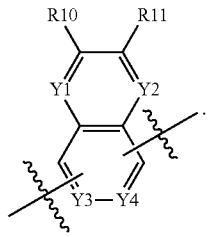

In an exemplary embodiment of the present specification, Y1 is N.

In an exemplary embodiment of the present specification, Y2 is N.

In an exemplary embodiment of the present specification, Y3 is CR.

In an exemplary embodiment of the present specification, Y4 is CR.

In an exemplary embodiment of the present specification, R is hydrogen.

In an exemplary embodiment of the present specification, A is

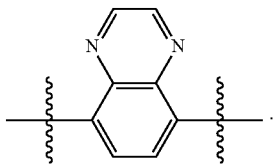

In an exemplary embodiment of the present specification, A is

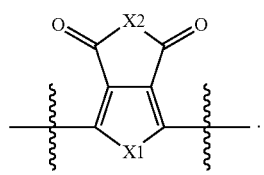

In an exemplary embodiment of the present specification, X1 is S.

In an exemplary embodiment of the present specification, X2 is NR.

In an exemplary embodiment of the present specification, R is a substituted or unsubstituted alkyl group.

In an embodiment of the present specification, R is an octyl group.

In an exemplary embodiment of the present specification, A is

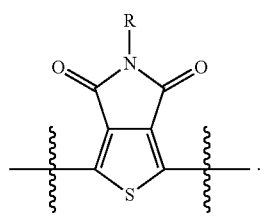

In an exemplary embodiment of the present specification, A is

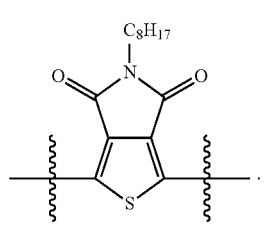

In an exemplary embodiment of the present specification, B is

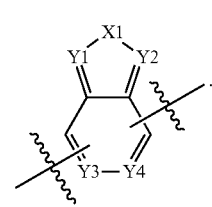

In an exemplary embodiment of the present specification, X1 is S.

In an exemplary embodiment of the present specification, Y1 is N.

In an exemplary embodiment of the present specification, Y2 is N.

In an exemplary embodiment of the present specification, Y3 is CR.

In an exemplary embodiment of the present specification, Y4 is CR.

In an exemplary embodiment of the present specification, R is a substituted or unsubstituted alkoxy group.

In an exemplary embodiment of the present specification, R is a dodecanoxy group.

In an exemplary embodiment of the present specification, B is

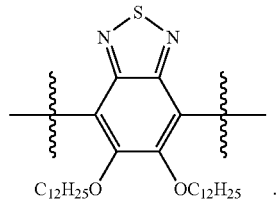

In an exemplary embodiment of the present specification, B is

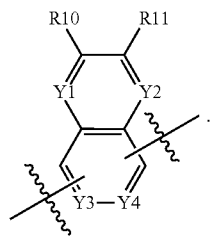

In an exemplary embodiment of the present specification, Y1 is N.

In an exemplary embodiment of the present specification, Y2 is N.

In an exemplary embodiment of the present specification, Y3 is CR.

In an exemplary embodiment of the present specification, Y4 is CR.

In an exemplary embodiment of the present specification, R is a substituted or unsubstituted aryl group.

In an exemplary embodiment of the present specification, R is a substituted or unsubstituted phenyl group.

In an exemplary embodiment of the present specification, R is an aryl group unsubstituted or substituted with an alkoxy group.

In an exemplary embodiment of the present specification, R is a phenyl group substituted with an octyloxy group.

In an exemplary embodiment of the present specification, B is

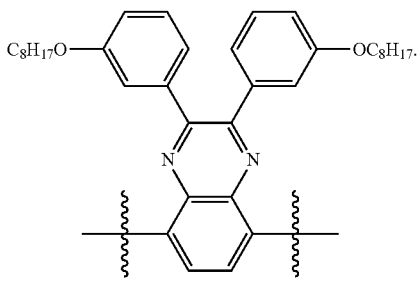

In an exemplary embodiment of the present specification, the first unit represented by Formula 1 is represented by any one of the following Formulae 1-1 to 1-3.

[Formula 1-1]

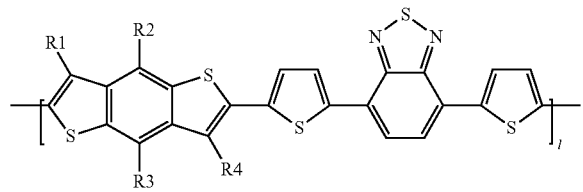

[Formula 1-2]

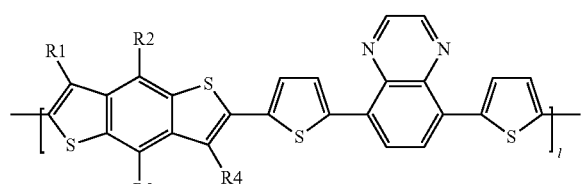

[Formula 1-3]

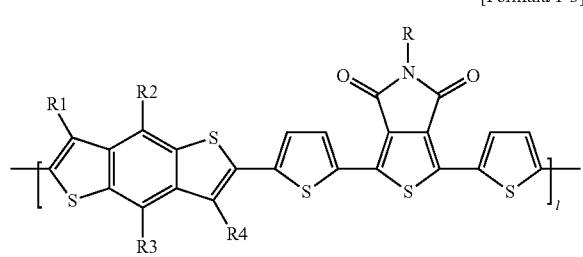

in Formulae 1-1 to 1-3,

R1 to R4, R, and l are the same as those defined in Formula 1.

In an exemplary embodiment of the present specification, the second unit represented by Formula 2 is represented by the following Formula 2-1 or 2-2.

[Formula 2-1]

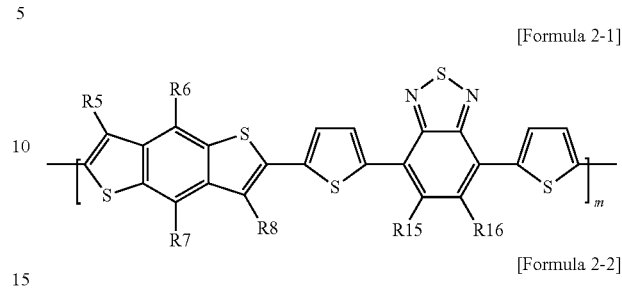

[Formula 2-2]

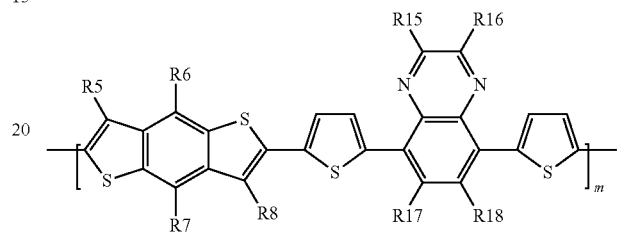

in Formula 2-1 and 2-2,

R5 to R8 and m are the same as those defined above, and R15 to R18 are the same as or different from each other, and are each independently selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; and a substituted or unsubstituted heterocyclic group; and two adjacent substituents may be combined with each other to form a ring.

In another exemplary embodiment, at least one of R15 to R18 is a substituted or unsubstituted alkyl group having 1 to 40 carbon atoms; a substituted or unsubstituted alkoxy group having 1 to 40 carbon atoms; a substituted or unsubstituted sulfide group having 1 to 40 carbon atoms; or a hydroxyl group.

In an exemplary embodiment of the present specification, the copolymer includes a copolymer represented by the following Formula 3.

[Formula 3]

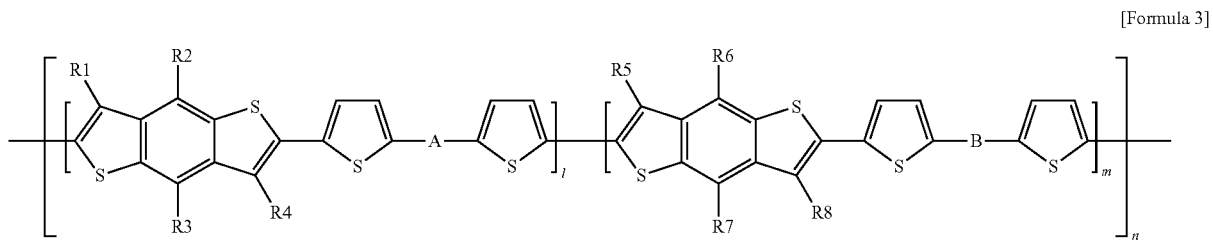

in Formula 3, l, m, R1 to R8, A, and B are the same as those defined above, and n is an integer of 1 to 10,000.

In an exemplary embodiment of the present specification, R1 is hydrogen.

In an exemplary embodiment of the present specification, R4 is hydrogen.

In an exemplary embodiment of the present specification, R5 is hydrogen.

In an exemplary embodiment of the present specification, R8 is hydrogen.

In an exemplary embodiment of the present specification, R2 is a substituted or unsubstituted alkoxy group.

In an exemplary embodiment of the present specification, R2 is a substituted or unsubstituted branched-chain alkoxy group.

In an exemplary embodiment of the present specification, R2 is a 2-ethyl-hexyloxy group.

In an exemplary embodiment of the present specification, R3 is a substituted or unsubstituted alkoxy group.

In an exemplary embodiment of the present specification, R3 is a substituted or unsubstituted branched-chain alkoxy group.

In an exemplary embodiment of the present specification, R3 is a 2-ethyl-hexyloxy group.

In an exemplary embodiment of the present specification, R6 is a substituted or unsubstituted alkoxy group.

In an exemplary embodiment of the present specification, R6 is a substituted or unsubstituted branched-chain alkoxy group.

In an exemplary embodiment of the present specification, R6 is a 2-ethyl-hexyloxy group.

In an exemplary embodiment of the present specification, R7 is a substituted or unsubstituted alkoxy group.

In an exemplary embodiment of the present specification, R7 is a substituted or unsubstituted branched-chain alkoxy group.

In an exemplary embodiment of the present specification, R7 is a 2-ethyl-hexyloxy group.

In an exemplary embodiment of the present specification, the copolymer including the first unit and the second unit is any one of the following Copolymers 1 to 6.

[Copolymer 1]

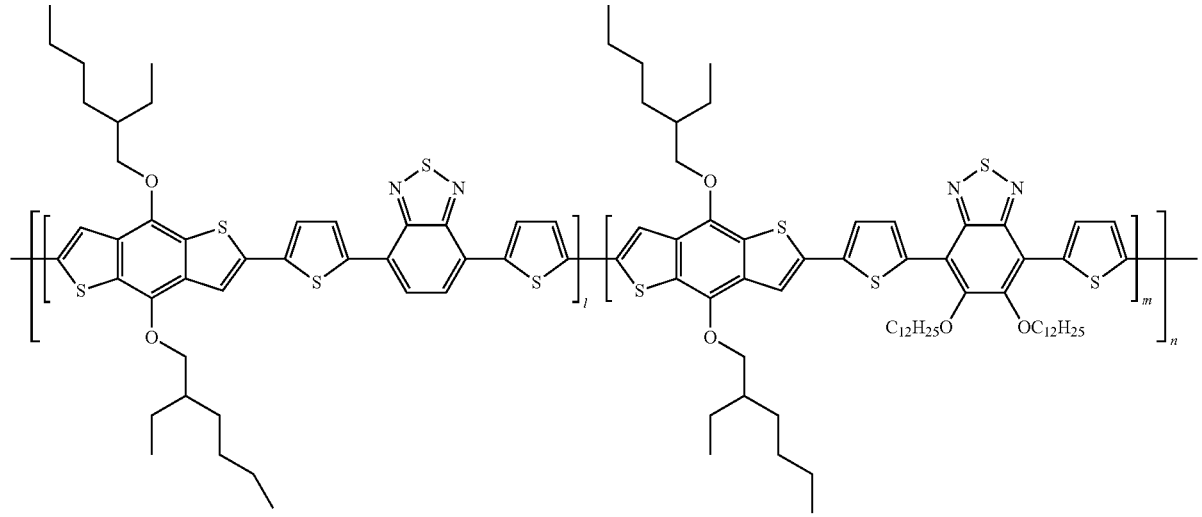

[Copolymer 2]

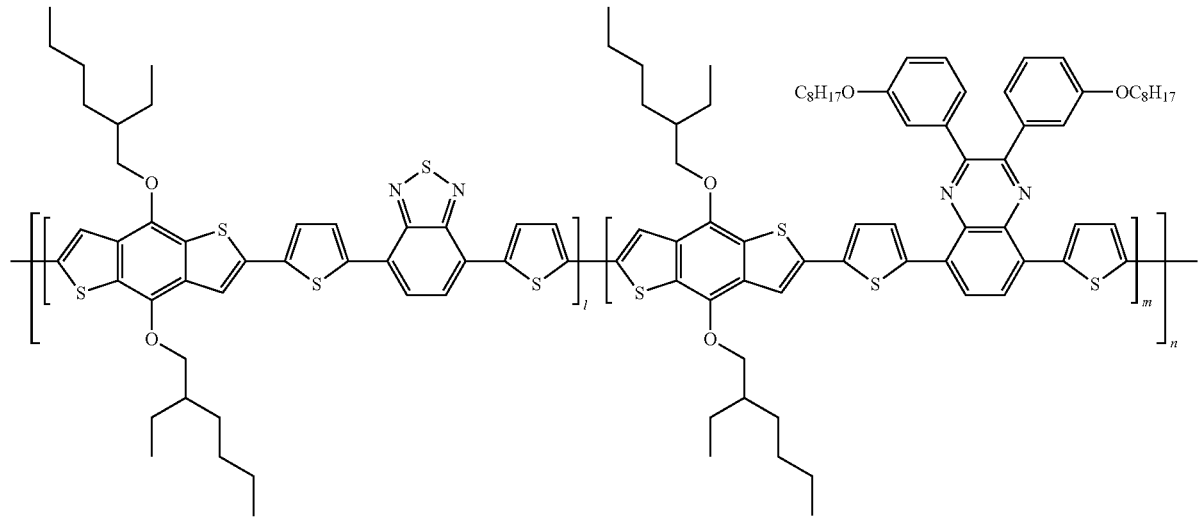

[Copolymer 3]
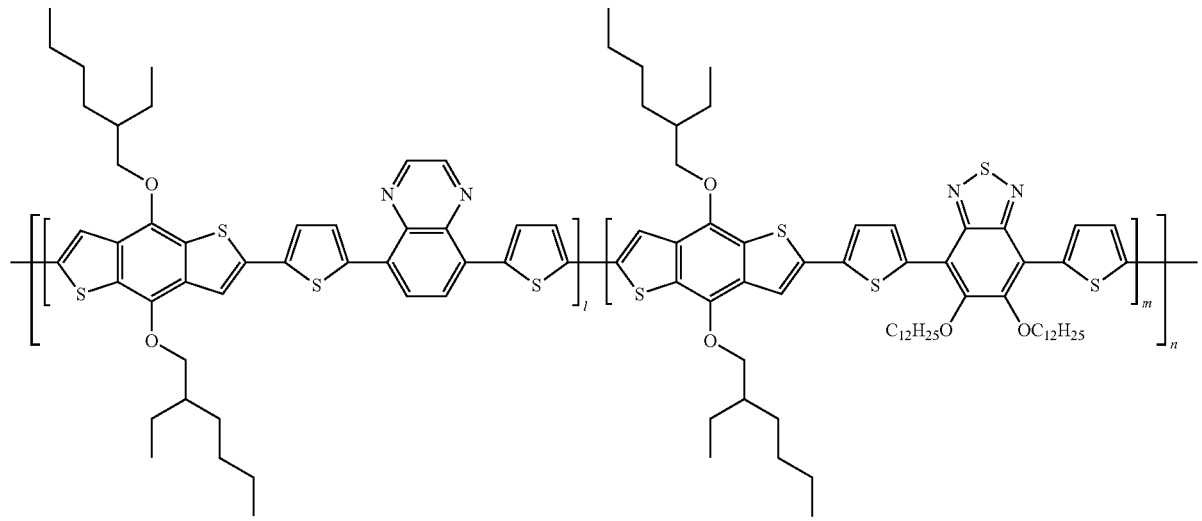
[Copolymer 4]
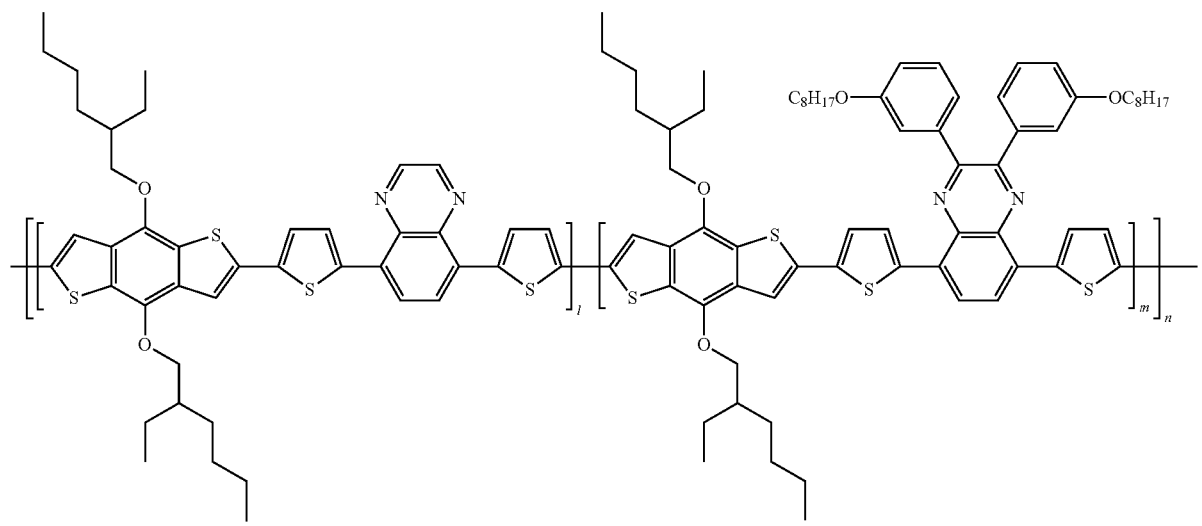
[Copolymer 5]
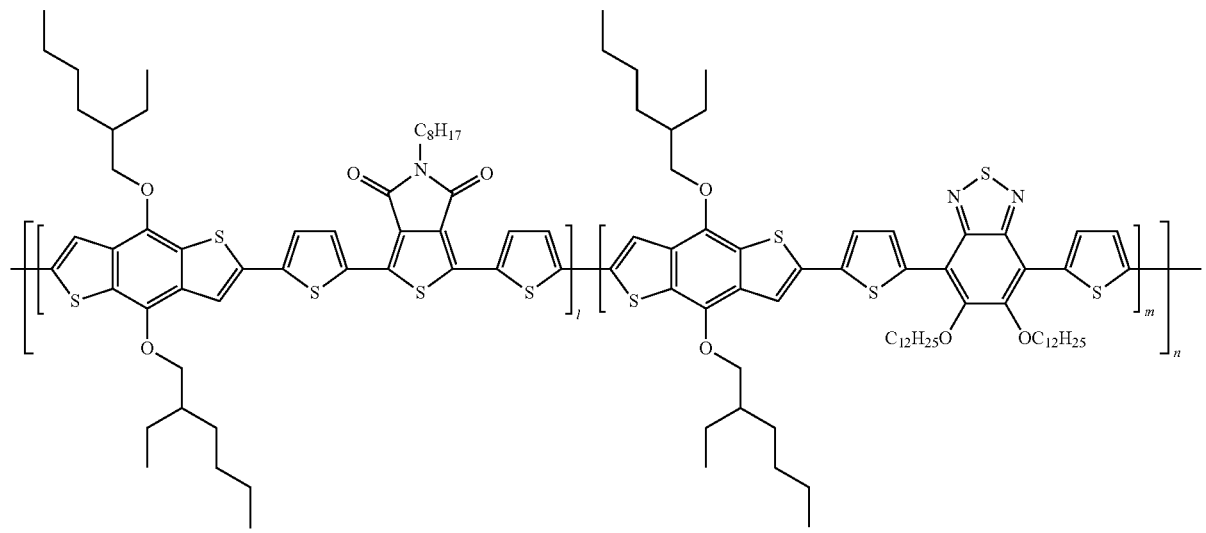

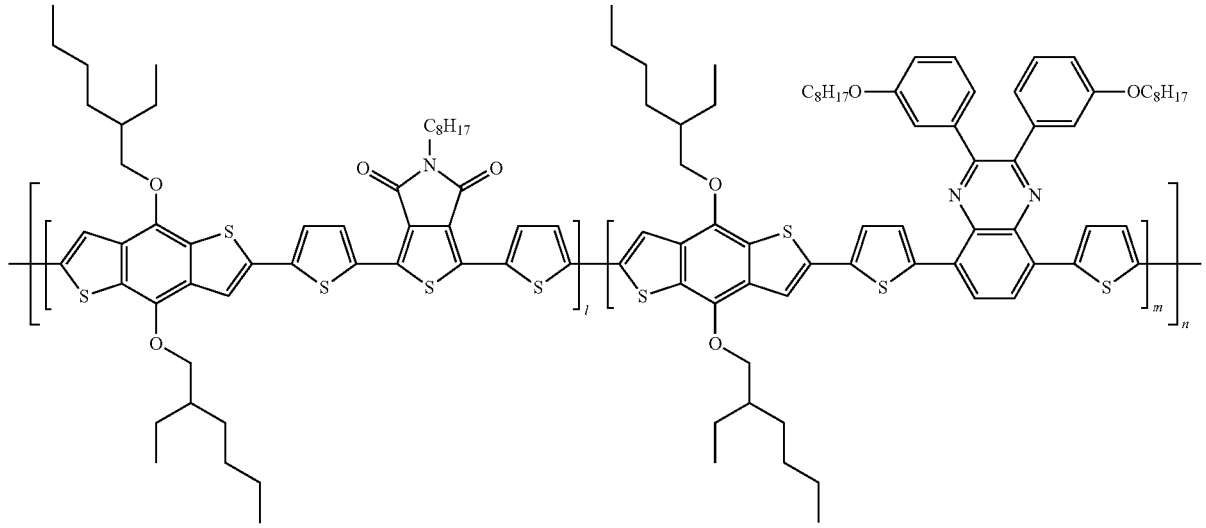

[Copolymer 6]

In Copolymers 1 to 6, l, m, and n are the same as those defined above.

In an exemplary embodiment of the present specification, the copolymer is selected from the group consisting of a random copolymer, an alternative copolymer, a block copolymer, a graft copolymer, and a starblock copolymer.

In another exemplary embodiment, the copolymer is an alternative copolymer.

In an exemplary embodiment of the present specification, an end group of the copolymer is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; and a substituted or unsubstituted heterocyclic group.

In an exemplary embodiment of the present specification, the end group of the copolymer is a heterocyclic group or an aryl group.

In an exemplary embodiment of the present specification, the end group of the copolymer is a 4-(trifluoromethyl)phenyl group.

According to an exemplary embodiment of the present specification, the number average molecular weight of the copolymer is preferably 500 g/mol to 1,000,000 g/mol. Preferably, the number average molecular weight of the copolymer is preferably 10,000 to 100,000. In an exemplary embodiment of the present specification, the number average molecular weight of the copolymer is 30,000 to 70,000.

According to an exemplary embodiment of the present specification, the copolymer may have a molecular weight distribution of 1 to 100. Preferably, the copolymer has a molecular weight distribution of 1 to 3.

The lower the molecular weight distribution and the larger the number average molecular weight are, the better the electrical properties and the mechanical properties are.

Furthermore, the number average molecular weight is preferably 100,000 or less in order to have a predetermined solubility or more and thus advantageously allows application of a solution application method.

The copolymers may be prepared based on Preparation Examples to be described later.

The copolymer according to the present specification may be prepared by a multi-step chemical reaction. Monomers may be prepared by an alkylation reaction, a Grignard reaction, a Suzuki coupling reaction, a Stille coupling reaction, and the like, and then final copolymers may be prepared by a carbon-carbon coupling reaction such as a Stille coupling reaction. When a substituent to be introduced is a boronic acid or boronic ester compound, the copolymer may be prepared by a Suzuki coupling reaction, and when a substituent to be introduced is a tributyltin compound, the copolymer may be prepared by a Stille coupling reaction, but the preparation of the copolymer is not limited thereto.

An exemplary embodiment of the present specification provides an organic solar cell including a first electrode; a second electrode provided opposite to the first electrode; and an organic material layer having one or more layers disposed between the first electrode and the second electrode and including a photoactive layer, in which one or more layers of the organic material layer include the copolymer.

Exemplary embodiments of the organic solar cell of the present specification may have a structure as illustrated in FIG. 1, but are not limited thereto.

FIG. 1 illustrates a structure of an organic solar cell in which a substrate 101, a first electrode 102, a hole transport layer 103, a photoactive layer 104, and a second electrode 105 are sequentially laminated.

The organic solar cell according to an exemplary embodiment of the present specification includes a first electrode, a photoactive layer, and a second electrode. The organic solar cell may further include a substrate, a hole transport layer, and/or an electron transport layer.

In an exemplary embodiment of the present specification, when the organic solar cell receives a photon from an external light source, an electron and a hole are generated between an electron donor and an electron acceptor. The generated hole is transported to an anode through an electron donor layer.

In an exemplary embodiment of the present specification, the organic material layer includes a hole transport layer, a hole injection layer, or a layer which transports and injects holes simultaneously, and the hole transport layer, the hole injection layer, or the layer which transports and injects holes simultaneously includes the copolymer.

In another exemplary embodiment, the organic material layer includes an electron injection layer, an electron transport layer, or a layer which injects and transports electrons simultaneously, and the electron injection layer, the electron transport layer, or the layer which injects and transports electrons simultaneously includes the copolymer.

In an exemplary embodiment of the present specification, when the organic solar cell receives a photon from an external light source, an electron and a hole are generated between an electron donor and an electron acceptor. The generated hole is transported to an anode through an electron donor layer.

In an exemplary embodiment of the present specification, the organic solar cell may further include an additional organic material layer. The organic solar cell may use an organic material simultaneously having various functions to decrease the number of organic material layers.

In an exemplary embodiment of the present specification, in the organic solar cell, a cathode, a photoactive layer, and an anode may be disposed in this order, or an anode, a photoactive layer, and a cathode may be disposed in this order, but the sequence is not limited thereto.

In another exemplary embodiment, in the organic solar cell, an anode, a hole transport layer, a photoactive layer, an electron transport layer, and a cathode may be disposed in this order, or a cathode, an electron transport layer, a photoactive layer, a hole transport layer, and an anode may be disposed in this order, but the sequence is not limited thereto.

In still another exemplary embodiment, a buffer layer may be provided between the photoactive layer and the hole transport layer, or between the photoactive layer and the electron transport layer. In this case, the hole injection layer may be further provided between the anode and the hole transport layer. Further, an electron injection layer may be further provided between the cathode and the electron transport layer.

In an exemplary embodiment of the present specification, the photoactive layer includes one or two or more selected from the group consisting of an electron donor and an electron acceptor, and the electron donor material includes the copolymer.

In an exemplary embodiment of the present specification, the electron acceptor material may be selected from the group consisting of a fullerene, a fullerene derivative, a bathocuproine, a semiconductor element, a semiconductor compound, and a combination thereof. Specifically, the electron acceptor material may be phenyl $C_{61}$-butyric acid methyl ester ($PC_{61}BM$) or phenyl $C_{71}$-butyric acid methyl ester ($PC_{71}BM$).

In an exemplary embodiment of the present specification, the electron donor and the electron acceptor are a bulk heterojunction (BHJ). The electron donor material and the electron acceptor material are mixed in a ratio (w/w) of 1:10 to 10:1.

The substrate in the present specification may be a glass substrate or a transparent plastic substrate, which has excellent transparency, surface smoothness, easiness in handling, and waterproof, but is not limited thereto, and there is no limitation as long as the substrate is a substrate typically used in the organic solar cell. Specific examples thereof include glass, polyethylene terephthalate (PET), polyethylene naphthalate (PEN), polypropylene (PP), polyimide (PI), triacetyl cellulose (TAC), and the like, but are not limited thereto.

The anode electrode may be a material having transparency and excellent conductivity, but is not limited thereto. Examples of the anode electrode include metal such as vanadium, chromium, copper, zinc and gold, or alloys thereof; metal oxides such as zinc oxide, indium oxide, indium tin oxide (ITO) and indium zinc oxide (IZO); a combination of metal and oxide, such as $ZnO:Al$ or $SnO_2$:Sb; and electrically conductive polymers, such as poly(3-methylthiophene), poly[3,4-(ethylene-1,2-dioxy)thiophene] (PEDT), polypyrrole and polyaniline, and the like, but are not limited thereto.

A method for forming the anode electrode is not particularly limited, but the anode electrode may be formed by being applied on one surface of the substrate or coated in the form of a film by using, for example, sputtering, E-beam, thermal deposition, spin coating, screen printing, inkjet printing, doctor blade or a gravure printing method.

When the anode electrode is formed on a substrate, the formation may be subjected to processes of washing, moisture removal and hydrophilic modification.

For example, when a patterned ITO substrate is sequentially washed with a detergent, acetone, and isopropyl alcohol (IPA), dried on a heating plate at 100° C. to 150° C. for 1 to 30 minutes, preferably at 120° C. for 10 minutes for moisture removal, and is completely washed, the surface of the substrate is hydrophilically modified.

By the surface modification as described above, the junction surface potential may be maintained at a level suitable for the surface potential of the photoactive layer. In addition, during the modification, a polymer thin film may be easily formed, and the quality of the thin film may also be enhanced.

Examples of a pretreatment technology of the anode electrode include a) a surface oxidation method using a parallel plate discharge, b) a method of oxidizing the surface through ozone produced by using UV rays in a vacuum state, c) a method of oxidizing the anode electrode by using an oxygen radical produced by the plasma, and the like.

One of the methods may be selected depending on the state of the anode electrode or the substrate. However, it is commonly preferred that oxygen on the surface of the anode electrode or the substrate is prevented from leaving, and moisture and organic materials are maximally suppressed from remaining even when any of the methods is used. In this case, a substantial effect of the pre-treatment may be maximized.

As a specific example, it is possible to use a method of oxidizing the surface from the ozone produced by using UV. In this case, after being ultrasonically cleaned, the patterned ITO substrate is baked and well dried on a hot plate, and introduced into a chamber, and then may be cleaned by the ozone produced by actuating a UV lamp to react an oxygen gas with the UV rays.

However, the method of modifying the surface of the patterned ITO substrate in the present specification need not be particularly limited, and any method may also be used as long as the method is a method of oxidizing the substrate.

The cathode electrode may be a metal having a small work function, but is not limited thereto. Specific examples thereof include metal such as magnesium, calcium, sodium, potassium, titanium, indium, yttrium, lithium, gadolinium, aluminum, silver, tin, and lead, or an alloy thereof; and a material having a multilayered structure, such as LiF/Al, LiO$_2$/Al, LiF/Fe, Al:Li, Al:BaF$_2$, and Al:BaF$_2$:Ba, but are not limited thereto.

The cathode electrode may be deposited and formed inside a thermal deposition device allowing a degree of vacuum of 5×10$^{-7}$ torr or less, but is not limited to the method.

The hole transport layer and/or electron transport layer materials serve to efficiently transfer electrons and holes separated from the photoactive layer to the electrode, and the material is not particularly limited.

The hole transport layer material may be PEDOT:PSS (Poly(3,4-ethylenediocythiophene) doped with poly(styrenesulfonic acid)), molybdenum oxide (MoO$_x$); vanadium oxide (V$_2$O$_5$); nickel oxide (NiO); and tungsten oxide (WO$_x$), and the like, but is not limited thereto.

The hole transport layer material may be electron-extracting metal oxides, and may be specifically a metal complex of 8-hydroxyquinoline; a complex including Alq$_3$; a metal complex including Liq; LiF; Ca; titanium oxide (TiO$_x$); zinc oxide (ZnO); cesium carbonate (Cs$_2$CO$_3$), and the like, but is not limited thereto.

The photoactive layer may be formed by dissolving a photoactive material such as an electron donor and/or an electron acceptor in an organic solvent, and then coating the resulting solution by a method such as spin coating, dip coating, screen printing, spray coating, doctor blade and brush painting, but the method is not limited thereto.

[Best Mode]

The preparation method of the copolymer and the manufacture of an organic solar cell including the same will be specifically described in the following Preparation Examples and Examples. However, the following Examples are provided to illustrate the present specification, but the scope of the present specification is not limited thereby.

EXAMPLE 1

Polymer Polymerization (Polymerization of Copolymer 1)

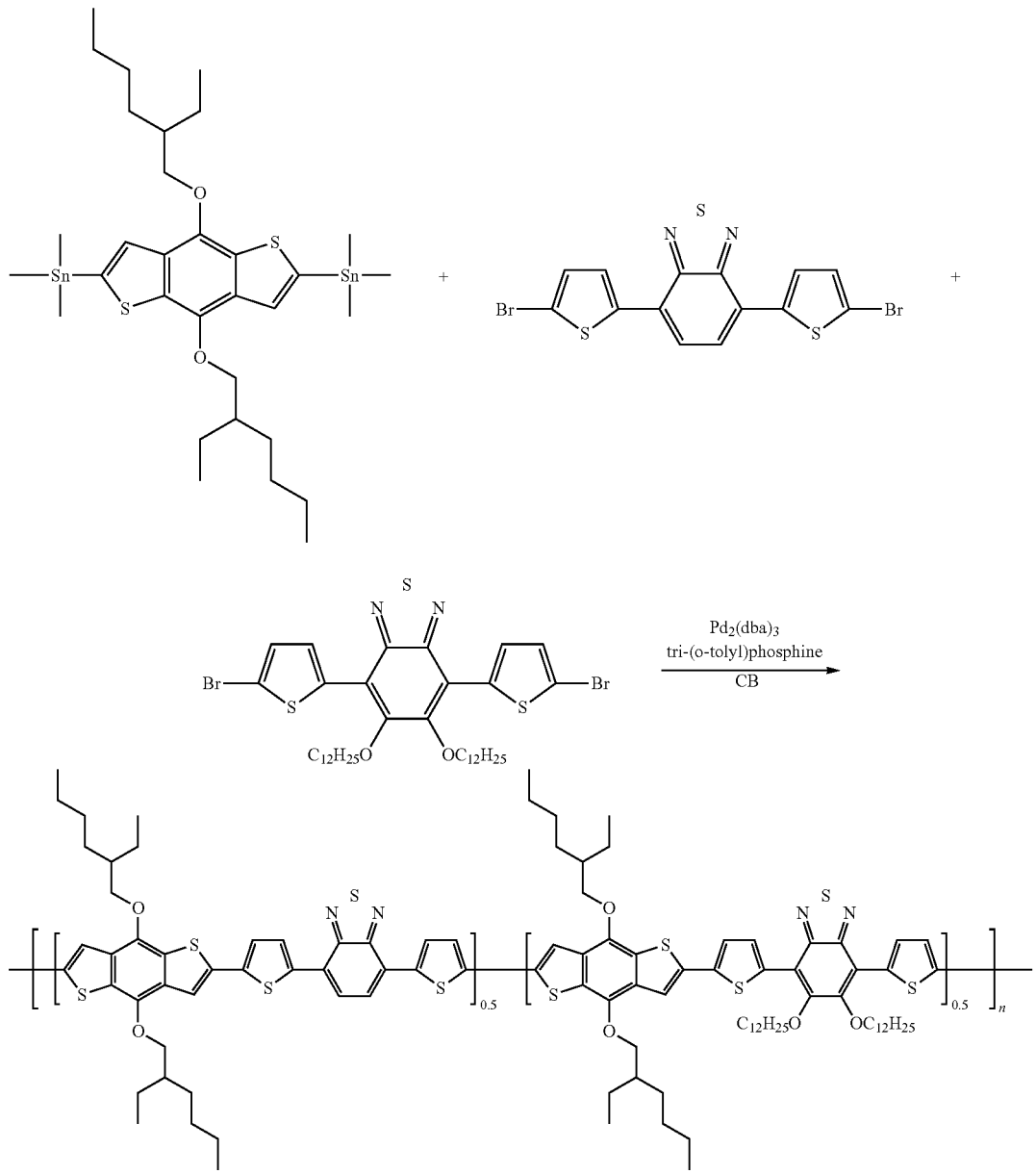

In the present specification, 2,6-bis(trimethyltin)-4,8-bis(2-ethylhexyloxy)benzo[1,2-b:4,5-b']dithiophene was prepared with reference to the prior literature (P. Morvillo, F. Parenti, R. Diana, C. Fontanesi, A. Mucci, F. Tassinari, L. Schenetti, Solar Energy Materials & Solar Cells 104, 2012, 45-52).

In the present specification, 4,7-bis(5-bromo-2-thienyl)-2,1,3-benzothiadiazole was prepared with reference to the prior literature (Q. Hou, Y. Xu, W. Yang, M. Yuan, J. Peng, Y. Cao, J. Mater. Chem. 12, 2002, 2887-2892).

In the present specification, 4,7-bis(5-bromothiophen-2-yl)-5,6-bis(dodecyloxy)benzo[c][1,2,5]thiadiazole was prepared with reference to the prior literature (C. H-Yang, Y. S-Chieh, C. C-Ti, C. C-Tsen, J. Mater. Chem. 22, 2012, 21549-21559). 5 ml of chlorobenzene, 0.4 g (0.5179 mmol) of 2,6-bis(trimethyltin)-4,8-bis(2-ethylhexyloxy)benzo[1,2-b:4,5-b']dithiophene, 0.1187 g (0.2589 mmol) of 4,7-bis(5-bromo-2-thienyl)-2,1,3-benzothiadiazole, 0.2141 g (0.2589 mmol) of 4,7-bis(5-bromothiophen-2-yl)-5,6-bis(dodecyloxy)benzo[c][1,2,5]thiadiazole, 14 mg of Pd$_2$(dba)$_3$ (tris(dibenzylideneacetone)dipalladium(0)), and 18 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 32%
Number average molecular weight: 15,000 g/mol
Weight average molecular weight: 36,200 g/mol

EXAMPLE 2

Polymer Polymerization (Polymerization of Copolymer 2)

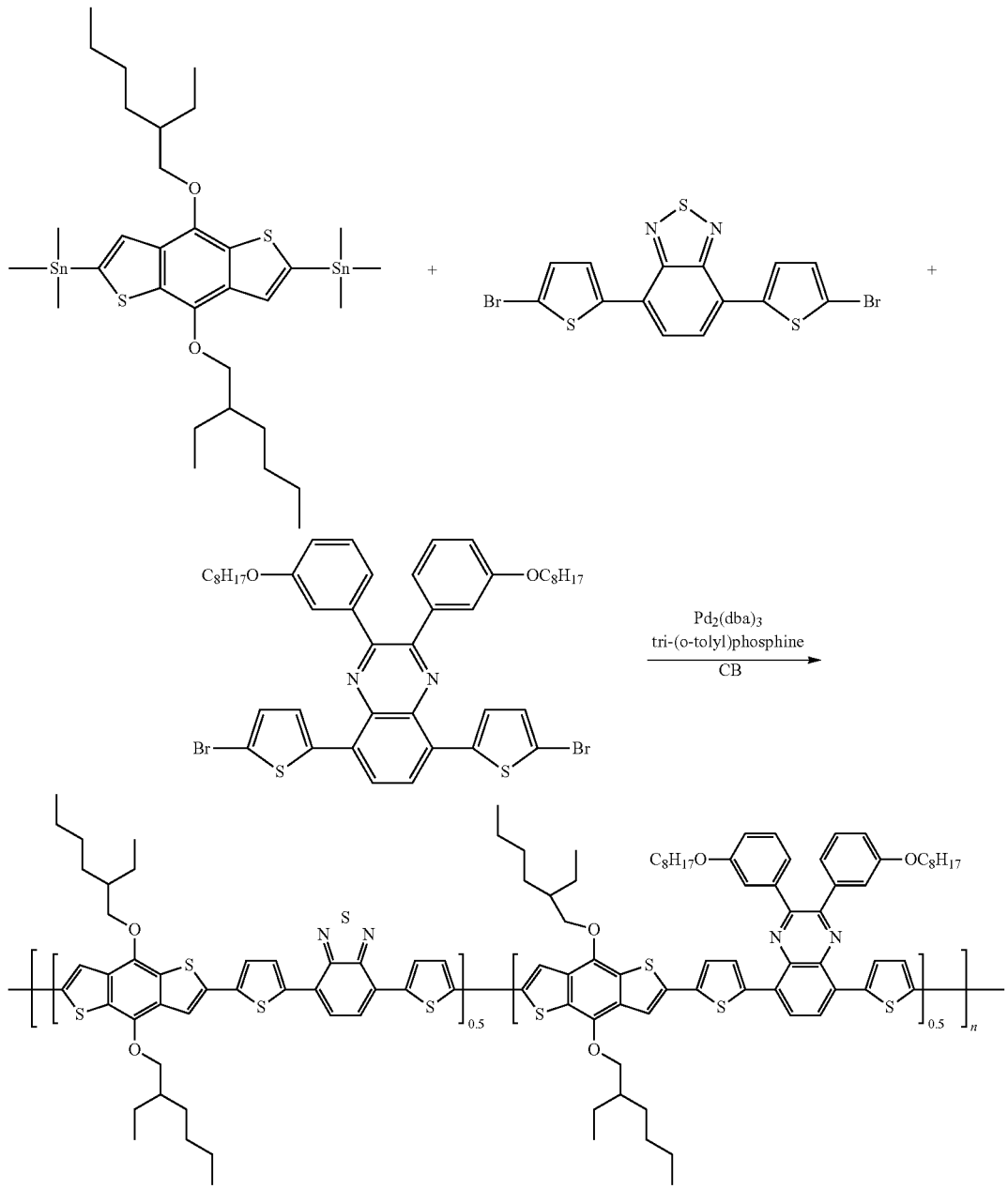

In the present specification, 5,8-bis(5-bromothiophene-2-yl)-2,3-bis(3-(octyloxyphenyl)quinoxaline was prepared with reference to the prior literature (D. Gedefaw, Y. Zhou, S. Hellstrom, L. Lindgren, L. M. Andersson, F. Zhang, W. Mammo, O. Inganas, M. R. Andersson, J. Mater. Chem. 19, 2009, 5359-5363).

5 ml of chlorobenzene, 0.4 g (0.5179 mmol) of 2,6-bis(trimethyltin)-4,8-bis(2-ethylhexyloxy)benzo[1,2-b:4,5-b']dithiophene, 0.1187 g (0.2589 mmol) of 4,7-bis(5-bromo-2-thienyl)-2,1,3-benzothiadiazole, 0.2229 g (0.2589 mmol) of 5,8-bis(5-bromothiophene-2-yl)-2,3-bis(3-(octyloxyphenyl)quinoxaline, 14 mg of Pd$_2$(dba)$_3$ (tris(dibenzylideneacetone)dipalladium(0)), and 18 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 28%

Number average molecular weight: 11,300 g/mol Weight average molecular weight: 31,900 g/mol

EXAMPLE 3

Polymer Polymerization (Polymerization of Copolymer 3)

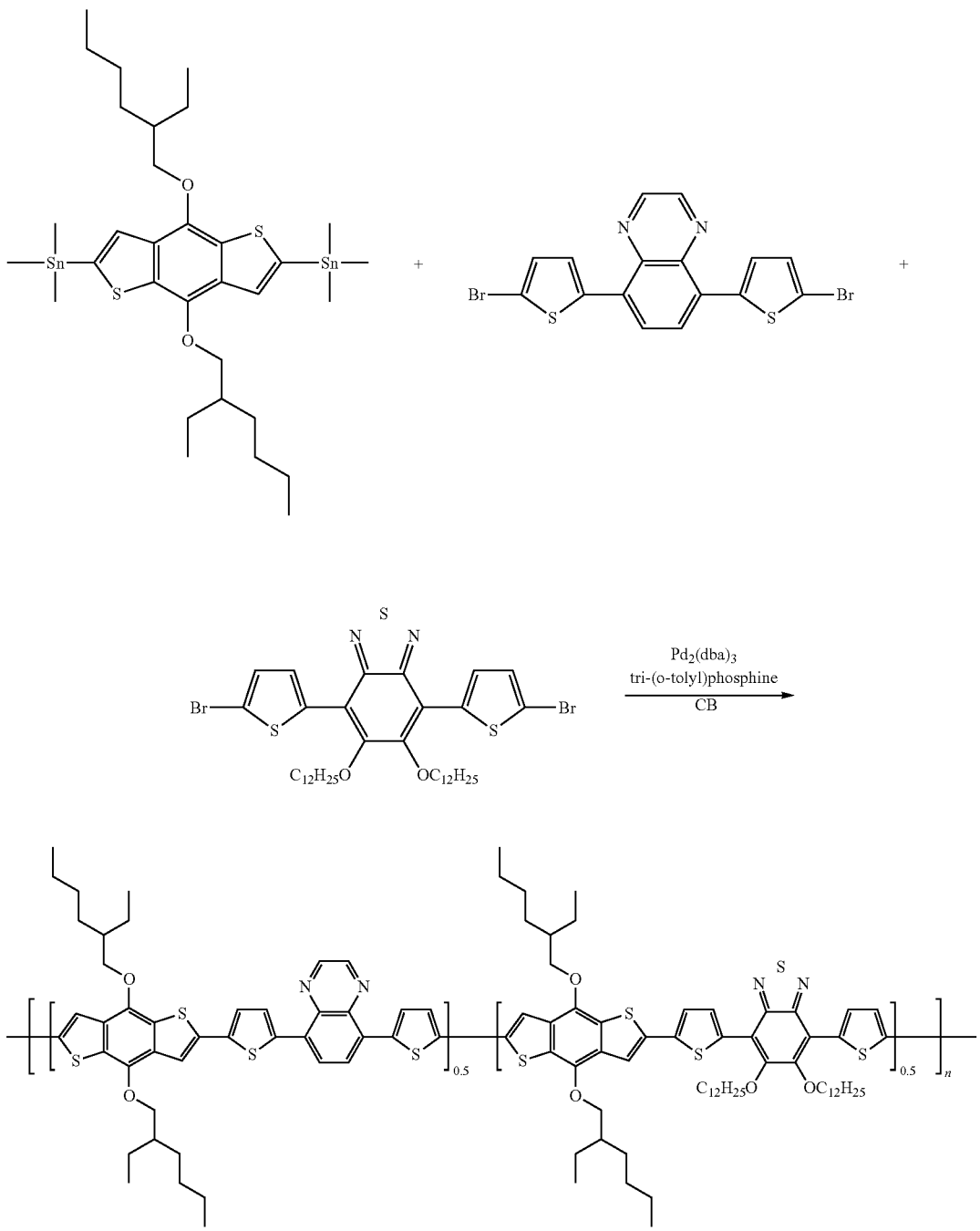

In the present specification, 5,8-bis(5-bromo-2-thienyl)quinoxaline was prepared with reference to the prior literature (N. Blouin, A. Michaud. D, Gendron, S. Wakim, E. Blair, R. Neagu-Plesu, M. Belletes, G. Durocher, Y. Tao, M. Leclerc, J. Am. Chem. Soc. 130, 2008, 732-742).

5 ml of chlorobenzene, 0.4 g (0.5179 mmol) of 2,6-bis(trimethyltin)-4,8-bis(2-ethylhexyloxy)benzo[1,2-b:4,5-b']dithiophene, 0.1171 g (0.2589 mmol) of 5,8-bis(5-bromo-2-thienyl)quinoxaline, 0.2141 g (0.2589 mmol) of 4,7-bis(5-bromothiophen-2-yl)-5,6-bis(dodecyloxy)benzo[c][1,2,5]thiadiazole, 14 mg of $Pd_2(dba)_3$ (tris(dibenzylideneacetone)dipalladium(0)), and 18 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 40%
Number average molecular weight: 19,500 g/mol
Weight average molecular weight: 64,000 g/mol

EXAMPLE 4

Polymer Polymerization (Polymerization of Copolymer 4)

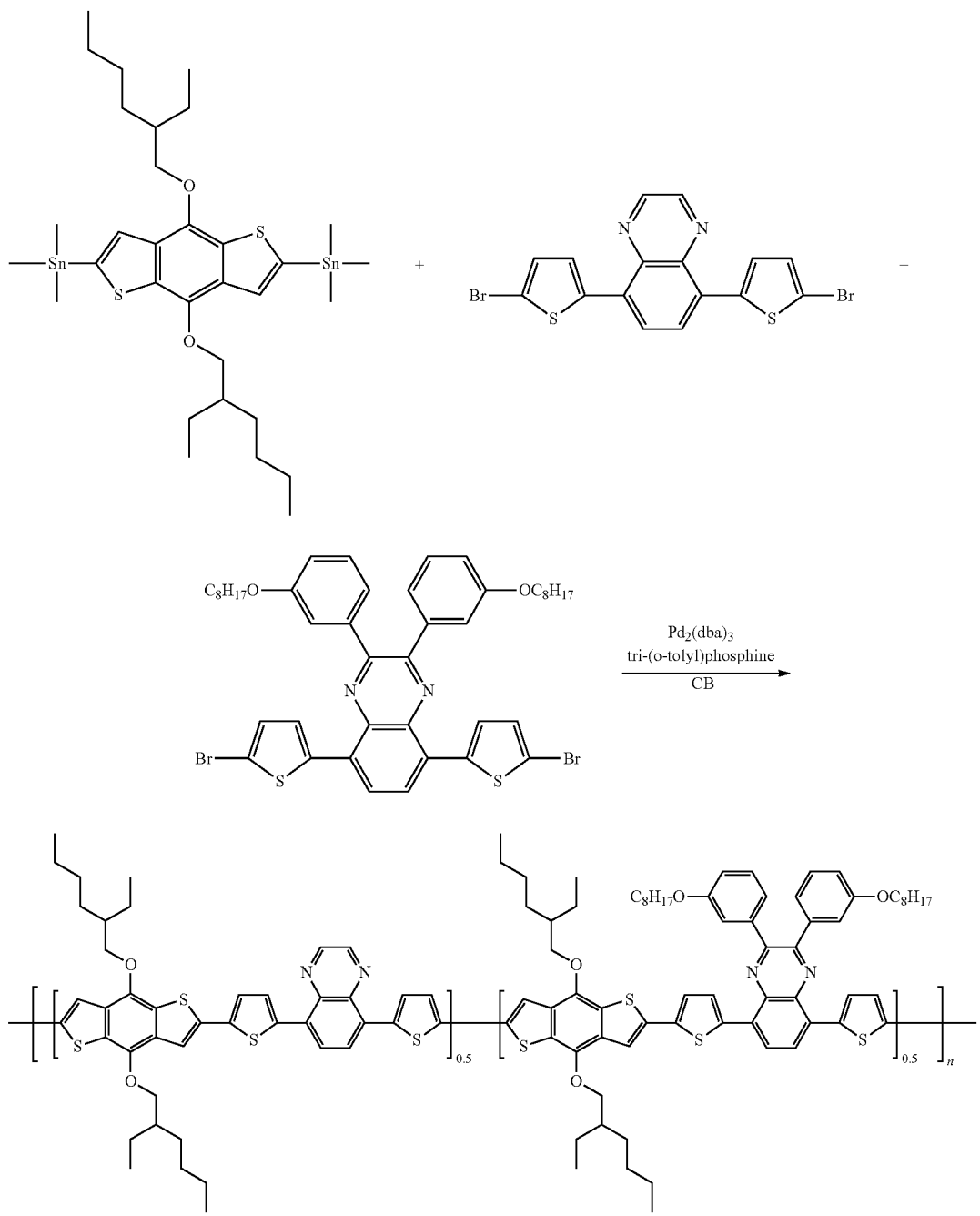

5 ml of chlorobenzene, 0.4 g (0.5179 mmol) of 2,6-bis(trimethyltin)-4,8-bis(2-ethylhexyloxy)benzo[1,2-b:4,5-b']dithiophene, 0.1171 g (0.2589 mmol) of 5,8-bis(5-bromo-2-thienyl)quinoxaline, 0.2229 g (0.2589 mmol) of 5,8-bis(5-bromothiophene-2-yl)-2,3-bis(3-(octyloxyphenyl)quinoxaline, 14 mg of $Pd_2(dba)_3$ (tris(dibenzylideneacetone)dipalladium(0)), and 18 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 55%
Number average molecular weight: 24,000 g/mol
Weight average molecular weight: 51,800 g/mol

EXAMPLE 5

Polymer Polymerization (Polymerization of Copolymer 5)

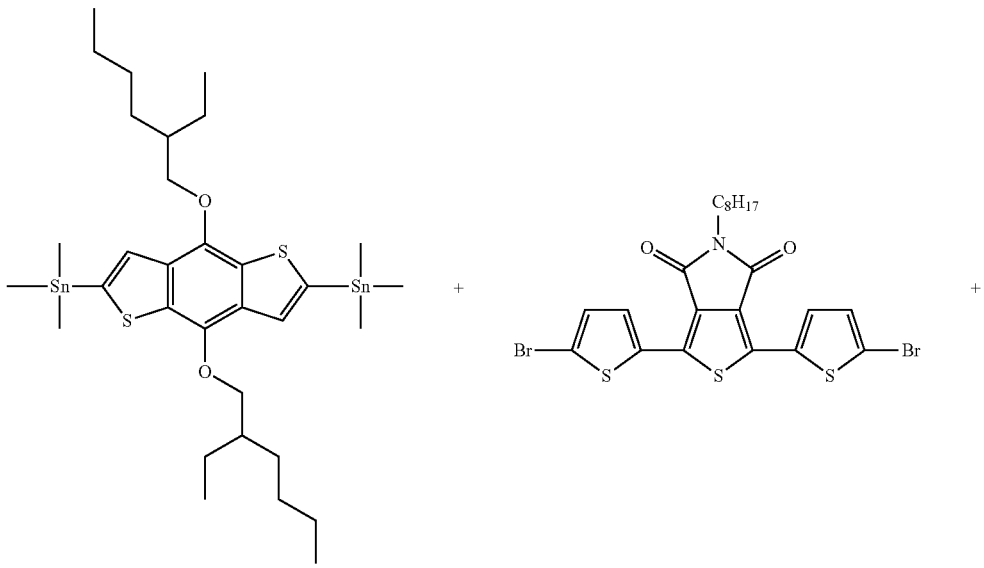

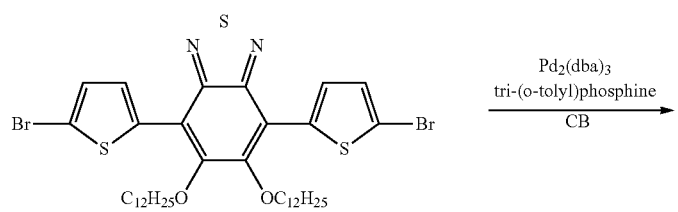

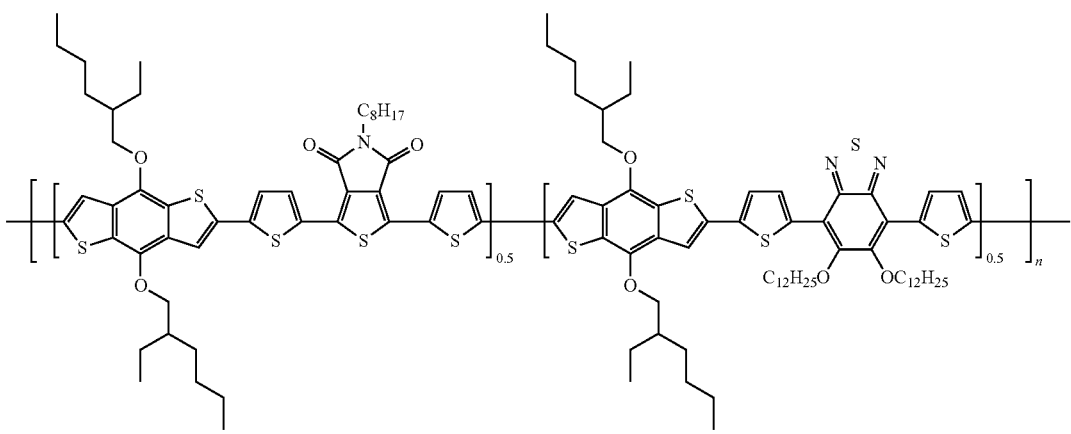

In the present specification, 1,3-di(2'-bromothien-5'-yl)-5-octylthieno[3,4-c]pyrrole-4,6-dione was prepared with reference to the prior literature (A. Najari, S. Beaupre, P. Berrouard, Y. Zou, J. Pouliot, C. Lepage-Perusse, M. Leclerc, Adv. Funct. Mater. 21, 718-728).

5 ml of chlorobenzene, 0.4 g (0.5179 mmol) of 2,6-bis(trimethyltin)-4,8-bis(2-ethylhexyloxy)benzo[1,2-b:4,5-b']dithiophene, 0.1521 g (0.2589 mmol) of 1,3-di(2'-bromothien-5'-yl)-5-octylthieno[3,4-c]pyrrole-4,6-dione, 0.2141 g (0.2589 mmol) of 4,7-bis(5-bromothiophen-2-yl)-5,6-bis(dodecyloxy)benzo[c][1,2,5]thiadiazole, 14 mg of Pd$_2$(dba)$_3$ (tris(dibenzylideneacetone)dipalladium(0)), and 18 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 55%
Number average molecular weight: 31,100 g/mol
Weight average molecular weight: 80,000 g/mol

EXAMPLE 6

Polymer Polymerization (Polymerization of Copolymer 6)

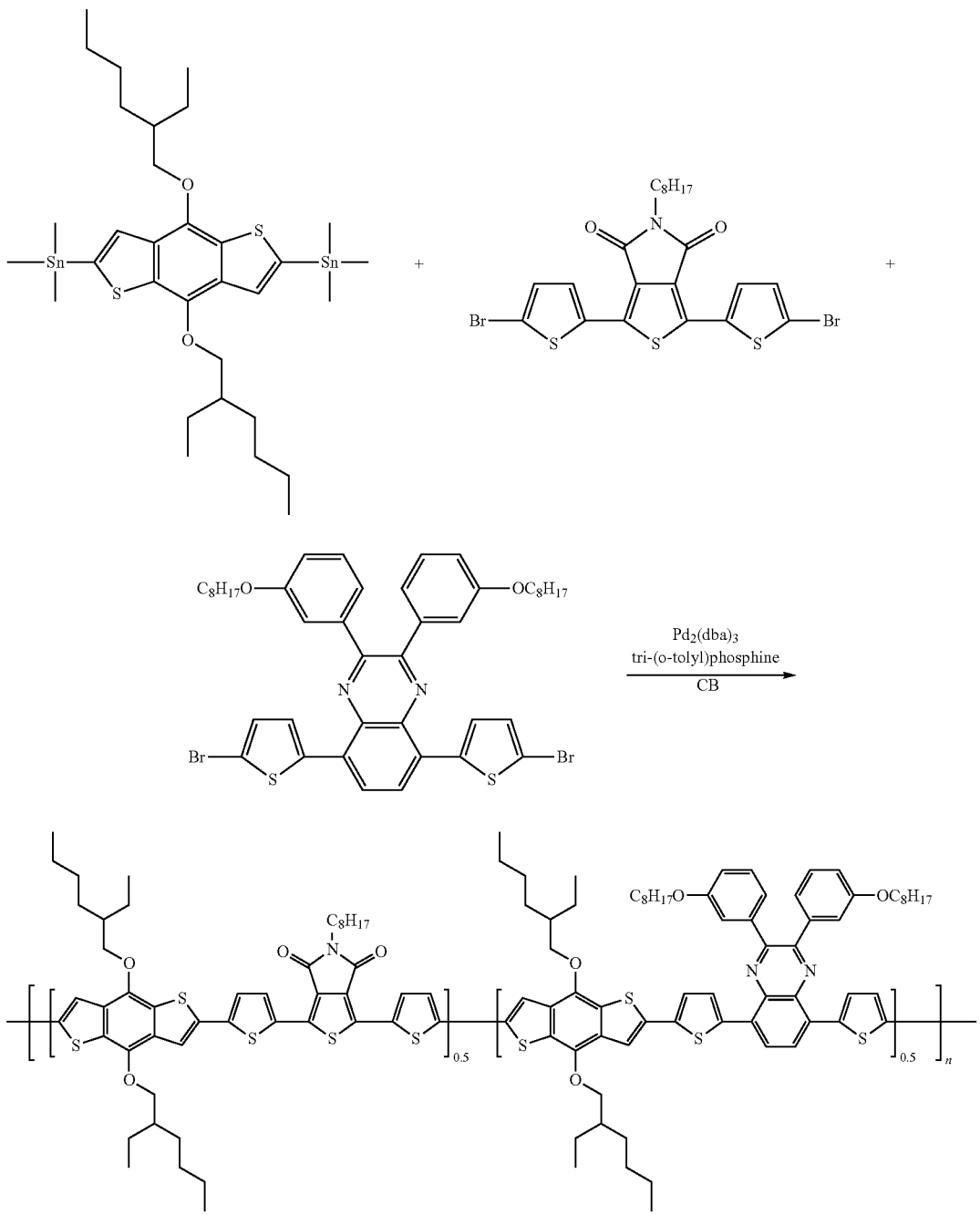

5 ml of chlorobenzene, 0.4 g (0.5179 mmol) of 2,6-bis (trimethyltin)-4,8-bis(2-ethylhexyloxy)benzo[1,2-b:4,5-b'] dithiophene, 0.1521 g (0.2589 mmol) of 1,3-di(2'-bromothien-5'-yl)-5-octylthieno[3,4-c]pyrrole-4,6-dione, 0.2229 g (0.2589 mmol) of 5,8-bis(5-bromothiophene-2-yl)-2,3-bis(3-(octyloxyphenyl)quinoxaline, 14 mg of $Pd_2(dba)_3$ (tris(dibenzylideneacetone)dipalladium(0)), and 18 mg of tri-(o-tolyl)phosphine were put into a microwave reactor vial, and reacted under the condition of 170° C. for 1 hour. After the mixture was cooled to room temperature and poured into methanol, the solid was filtered and subjected to Soxhlet extraction in methanol, acetone, hexane, and chloroform, and then the chloroform portion was again precipitated in methanol to filter the solid.

Yield: 55%

Number average molecular weight: 31,100 g/mol

Weight average molecular weight: 80,000 g/mol

Preparation and Characteristic Measurement of Organic Solar Cell

PREPARATION EXAMPLE 1

Preparation-1 of Organic Solar Cell

Copolymer 1 prepared in Example 1 and $PC_{71}BM$ were dissolved in a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, spin coating was performed by using PEDOT:PSS (baytrom P) in a thickness of 45 nm, and heat treatment was performed at 120° C. for 5 minutes. For the coating of the photoactive layer, the copolymer 1-$PC_{71}BM$ composite solution was filtered with a 0.45 μm PP syringe filter and spin-coated, and Al was deposited thereon in a thickness of 200 nm by using a thermal evaporator under a vacuum of $3 \times 10^{-8}$ torr to manufacture an organic solar cell.

PREPARATION EXAMPLE 2

Preparation-2 of Organic Solar Cell

Copolymer 2 prepared in Example 2 and $PC_{71}BM$ were dissolved in a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, spin coating was performed by using PEDOT:PSS (baytrom P) to have a thickness of 45 nm, and heat treatment was performed at 120° C. for 10 minutes. For the coating of the photoactive layer, the copolymer 2-$PC_{71}BM$ composite solution was filtered with a 0.45 μm PP syringe filter and spin-coated, and Al was deposited thereon to have a thickness of 200 nm by using a thermal evaporator under a vacuum of $3 \times 10^{-8}$ torr to manufacture an organic solar cell.

PREPARATION EXAMPLE 3

Preparation-3 of Organic Solar Cell

Copolymer 3 prepared in Example 3 and $PC_{71}BM$ were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, spin coating was performed by using PEDOT:PSS (baytrom P) to have a thickness of 45 nm, and heat treatment was performed at 120° C. for 10 minutes. For the coating of the photoactive layer, the copolymer 3-$PC_{71}BM$ composite solution was filtered with a 0.45 μm PP syringe filter and spin-coated, and Al was deposited thereon to have a thickness of 200 nm by using a thermal evaporator under a vacuum of $3 \times 10^{-8}$ torr to manufacture an organic solar cell.

PREPARATION EXAMPLE 4

Preparation-4 of Organic Solar Cell

Copolymer 4 prepared in Example 4 and $PC_{71}BM$ were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, spin coating was performed by using PEDOT:PSS (baytrom P) in a thickness of 45 nm, and heat treatment was performed at 120° C. for 10 minutes. For the coating of the photoactive layer, the copolymer 4-$PC_{71}BM$ composite solution was filtered with a 0.45 μm PP syringe filter and spin-coated, and Al was deposited thereon to have a thickness of 200 nm by using a thermal evaporator under a vacuum of $3 \times 10^{-8}$ torr to manufacture an organic solar cell.

PREPARATION EXAMPLE 5

Preparation-5 of Organic Solar Cell

Copolymer 5 prepared in Example 5 and $PC_{71}BM$ were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, spin coating was performed by using PEDOT:PSS (baytrom P) to have a thickness of 45 nm, and heat treatment was performed at 120° C. for 10 minutes. For the coating of the photoactive layer, the copolymer 5-$PC_{71}BM$ composite solution was filtered with a 0.45 μm PP syringe filter and spin-coated, and Al was deposited thereon to have a thickness of 200 nm by using a thermal evaporator under a vacuum of $3 \times 10^{-8}$ torr to manufacture an organic solar cell.

PREPARATION EXAMPLE 6

Preparation-6 of Organic Solar Cell

Copolymer 6 prepared in Example 6 and $PC_{71}BM$ were dissolved at a ratio of 1:2 in chlorobenzene (CB) to prepare a composite solution. In this case, the concentration was adjusted to 2.0 wt %, and the organic solar cell was made to have a structure of ITO/PEDOT:PSS/a photoactive layer/Al. The glass substrate on which the ITO was applied was ultrasonically cleaned by using distilled water, acetone, and 2-propanol, the ITO surface was treated with ozone for 10 min, spin coating was performed by using PEDOT:PSS (baytrom P) to have a thickness of 45 nm, and heat treatment was performed at 120° C. for 10 minutes. For the coating of the photoactive layer, the copolymer 5-PC71BM composite solution was filtered with a 0.45 μm PP syringe filter and spin-coated, and Al was deposited thereon to have a thickness of 200 nm by using a thermal evaporator under a vacuum of $3 \times 10^{-8}$ torr to manufacture an organic solar cell.

COMPARATIVE EXAMPLE 1

An organic solar cell was manufactured under the same conditions as in Preparation Examples 1 to 6, except that Copolymer 7 and $PC_{71}BM$ were dissolved at a ratio of 1:2 in chlorobenzene (CB).

COMPARATIVE EXAMPLE 2

An organic solar cell was manufactured under the same conditions as in Preparation Examples 1 to 6, except that Copolymer 8 and PC71BM were dissolved at a ratio of 1:2 in chlorobenzene (CB).

TEST EXAMPLE 1

The photoelectric conversion characteristics of the organic solar cells manufactured in Preparation Examples 1 to 6 and Comparative Examples 1 and 2 were measured under the condition of 100 mW/cm² (AM 1.5), and the results are shown in the following Table 1.

TABLE 1

| Active layer | | $V_{oc}$ (V) | $J_{sc}$ (mA/cm²) | FF | PCE (%) |
|---|---|---|---|---|---|
| Preparation Example 1 | Copolymer 1/$PC_{71}BM$ = 1:2 | 0.64 | 7.46 | 64.0 | 3.02 |
| Preparation Example 2 | Copolymer 2/$PC_{71}BM$ = 1:2 | 0.63 | 7.27 | 68.5 | 3.08 |
| Preparation Example 3 | Copolymer 3/$PC_{71}BM$ = 1:2 | 0.63 | 8.44 | 69.4 | 3.69 |
| Preparation Example 4 | Copolymer 4/$PC_{71}BM$ = 1:2 | 0.64 | 8.41 | 68.1 | 3.64 |
| Preparation Example 5 | Copolymer 5/$PC_{71}BM$ = 1:2 | 0.61 | 7.43 | 68.7 | 3.07 |
| Preparation Example 6 | Copolymer 6/$PC_{71}BM$ = 1:2 | 0.62 | 7.36 | 67.8 | 3.08 |
| Comparative Example 1 | Copolymer 7/$PC_{71}BM$ = 1:2 | 0.34 | 3.49 | 32.6 | 0.39 |
| Comparative Example 2 | Copolymer 8/$PC_{71}BM$ = 1:2 | 0.33 | 3.97 | 34.3 | 0.45 |

In Table 1, the total thickness means the thickness of the active layer in the organic solar cell, $V_{oc}$ means an open-circuit voltage, $J_{sc}$ means a short-circuit current, FF means a fill factor, and PCE means an energy conversion efficiency. The open-circuit voltage and the short-circuit current are the intercept of the X-axis and the Y-axis in the fourth quadrant of the voltage-current density curve, respectively, and when the two values becomes high, the efficiency of the solar cell is desirably increased. Furthermore, the fill factor is a value obtained by dividing the area of a rectangle which may be drawn inside the curve by the product of the short-circuit current and the open-circuit voltage. When the three values are divided by the intensity of light irradiated, the energy conversion efficiency may be obtained, and the higher value is preferred.

In Copolymers 7 and 8 used in Comparative Examples 1 and 2, respectively, a hexyl group was introduced into thiophene compared to Copolymers 1 and 2 used in Preparation Examples 1 and 2, respectively. When the group was introduced into the organic solar cell, it can be seen that the open-circuit voltage, short-circuit voltage, and FF were all decreased as in Table 1, and thus, the overall device efficiency was shown to be low. It can be expected that the alkyl group was introduced into thiophene to cause a steric hindrance with benzodithiophene with a bulk structure positioned next to, an efficient intramolecular charge transfer was interrupted while the structure of the main chain was tilted, and stacking between polymer main chains was interrupted to cause the short-circuit to decrease from a value of 7 to 8 mA/cm² to a value of ~3 mA/cm² and the FF to decrease from ~60 to ~30, and that the absolute value of the HOMO energy level was decreased due to the electron donating effect, and as a result, the open-circuit voltage in the device was decreased from ~0.6 to ~0.3. However, since the aforementioned result is a result that reflects an effect of each material layer with the interface, what was mentioned above is not the only reason for a drop in efficiency.

FIG. 2 is a view illustrating a current-voltage curve of organic solar cells of Preparation Examples 1 to 6 of the present specification.

FIG. 3 is a view illustrating a current-voltage curve of organic solar cells of Comparative Examples 1 to 2 of the present specification.

TEST EXAMPLE 2

The solubility of each monomer used in Preparation Examples 1 to 6 in chlorobenzene at room temperature was shown in the following Table 2.

TABLE 2

| Monomer structure | Solubility (mg/ml) |
|---|---|
| 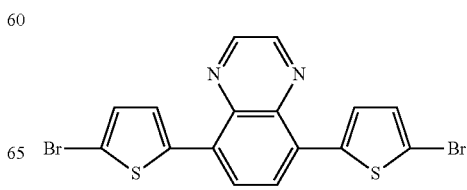 | 5 |
| | 11 |

TABLE 2-continued

| Monomer structure | Solubility (mg/ml) |
|---|---|
| (structure with C₈H₁₇, thiophene-Br, pyrrole-dione) | 23 |
| (structure with C₈H₁₇O, phenyl, quinoxaline, thiophene-Br) | 189 |
| (benzothiadiazole with thiophene-Br, OC₁₂H₂₅) | 165 |

TEST EXAMPLE 3

The solubility of the copolymers prepared by changing the ratio of the first unit and the second unit in Preparation Example 1 in chlorobenzene at room temperature was shown in the following Table 3.

TABLE 3

| l:m | Solubility (mg/ml) |
|---|---|
| 75:25 | Not dissolved |
| 62.5:37.5 | Not dissolved |
| 50:50 | 3 |
| 37.5:62.5 | 7 |
| 25:75 | 26 |

TEST EXAMPLE 4

The solubility of the copolymers prepared by changing the ratio of the first unit and the second unit in Preparation Example 1 in 1,2,4-trimethylbenzene at room temperature was shown in the following Table 4.

TABLE 4

| l:m | Solubility (mg/ml) |
|---|---|
| 75:25 | Not dissolved |
| 62.5:37.5 | Not dissolved |
| 50:50 | Not dissolved |
| 37.5:62.5 | Not dissolved |
| 25:75 | 19 |

EXPLANATION OF REFERENCE NUMERALS AND SYMBOLS

101: Substrate
102: First electrode
103: Hole transport layer
104: Photoactive layer
105: Second electrode

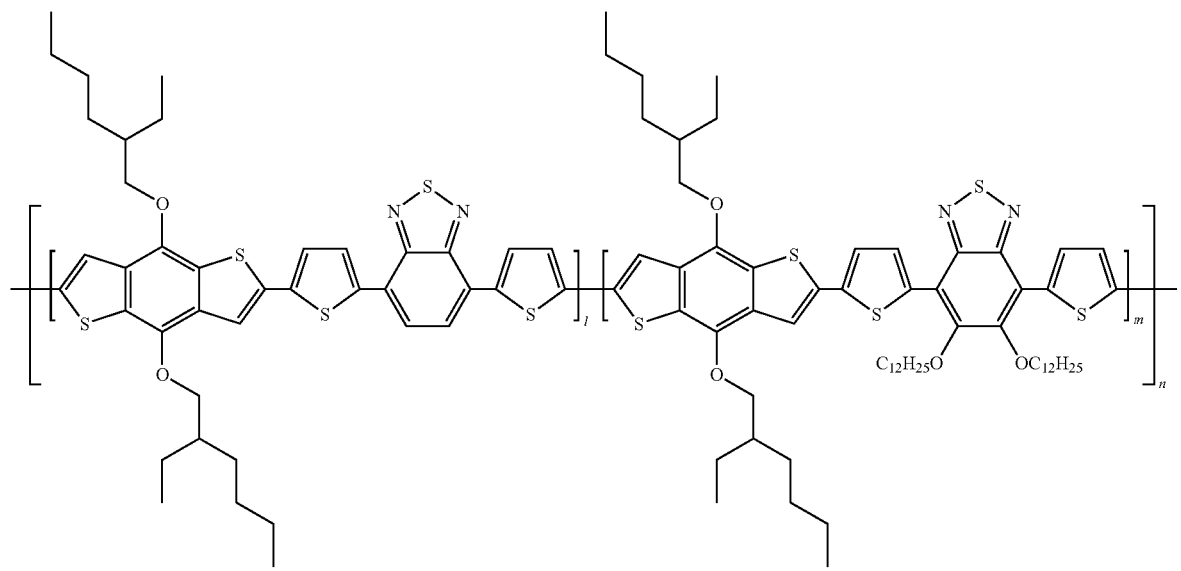

The invention claimed is:
1. A copolymer comprising:
a first unit of Formula 1; and
a second unit of Formula 2:

[Formula 1]

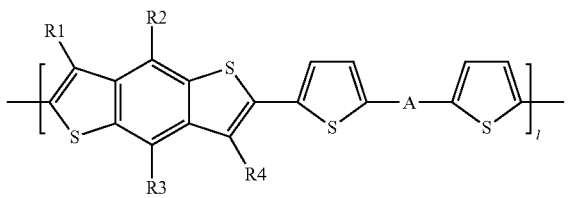

[Formula 2]

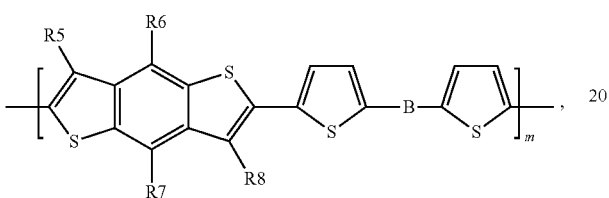

wherein in Formulae 1 and 2:
l is a real number, which is 0<l<1 as a mole fraction,
m is a real number, which is 0<m<1 as a mole fraction, and
l+m=1;
A and B are different from each other, and comprise one or more moieties selected from the group consisting of a direct bond; a monocyclic or polycyclic substituted or unsubstituted divalent heterocyclic group; a monocyclic or polycyclic substituted or unsubstituted divalent aromatic cyclic group; and a fused divalent ring in which a monocyclic or polycyclic heterocyclic group and a monocyclic or polycyclic aromatic cyclic group are substituted or unsubstituted;
R1, R4, R5 and R8 are the same as or different from each other, and are each independently selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group; and
R2, R3, R6 and R7 are the same as or different from each other, and are each independently selected from the group consisting of hydrogen; deuterium; a halogen group; a nitrile group; a nitro group; an imide group; an amide group; a hydroxyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; and a substituted or unsubstituted aryl group.

2. The copolymer of claim 1, wherein A and B are different from each other, and each is selected from any one of the following Formulae:

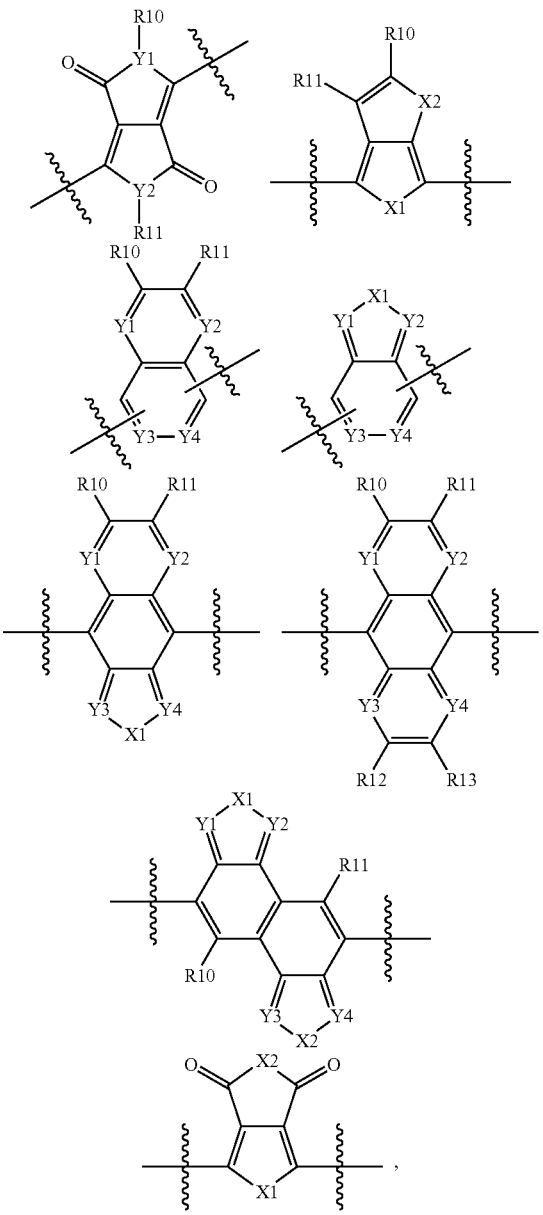

wherein:
X1 and X2 are the same as or different from each other, and each independently is selected from the group consisting of CRR', NR, O, SiRR', PR, S, GeRR', Se, and Te, Y1 to Y4 are the same as or different from each other, and each independently is selected from the group consisting of CR, N, SiR, P, and GeR; and R10 to R13 and R and R' are the same as or different from each other, and each independently is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

3. The copolymer of claim 1, wherein a solubility of the second unit is larger than that of the first unit.

4. The copolymer of claim 1, wherein a solubility of the second unit is 2 to 10 times larger than that of the first unit.

5. The copolymer of claim 1, wherein a solubility of a copolymer comprising the first unit and the second unit in a solution selected from the group consisting of a chlorinated solvent, toluene, xylenes, trimethylbenzenes, and tetrahydrofuran is 1 mg/ml to 200 mg/ml at room temperature.

6. The copolymer of claim 1, wherein a solubility of the copolymer comprising the first unit and the second unit in one or two or more solutions selected from the group consisting of chlorobenzene, toluene, xylene, and trimethylbenzene is 1 mg/ml to 200 mg/ml at room temperature.

7. The copolymer of claim 1, wherein B comprises at least one substituent which increases a solubility at a side chain.

8. The copolymer of claim 1, wherein B comprises at least one of a substituted or unsubstituted alkyl group having 1 to 40 carbon atoms, a substituted or unsubstituted alkoxy group having 1 to 40 carbon atoms, a substituted or unsubstituted sulfide group having 1 to 40 carbon atoms, and a hydroxyl group at a side chain.

9. The copolymer of claim 1, wherein the first unit of Formula 1 is any one of Formulae 1-1 to 1-3:

[Formula 1-1]

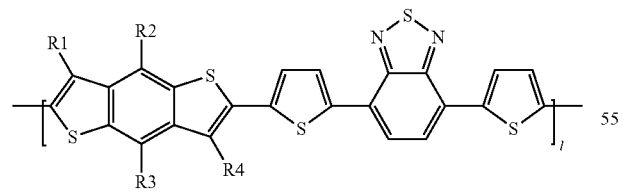

[Formula 1-2]

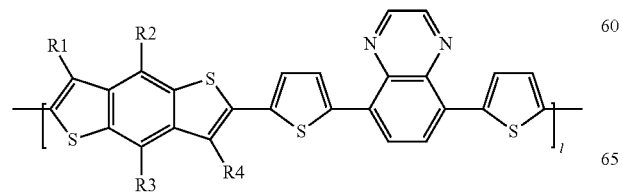

[Formula 1-3]

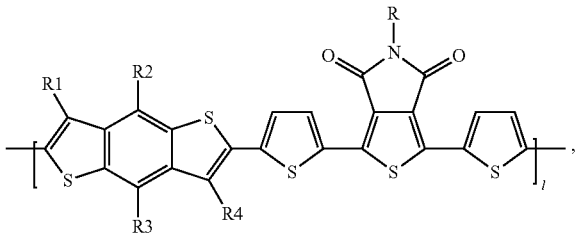

wherein in Formulae 1-1 to 1-3:
l is a real number, which is 0<l<1;
R1 and R4 are the same as or different from each other, and each independently is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group;
R2 and R3 are the same as or different from each other, and each independently is selected from the group consisting of hydrogen; deuterium; a halogen group; a nitrile group; a nitro group; an imide group; an amide group; a hydroxyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; and a substituted or unsubstituted aryl group; and
R is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; and a substituted or unsubstituted heterocyclic group.

10. The copolymer of claim 1, wherein the second unit of Formula 2 is Formula 2-1 or 2-2:

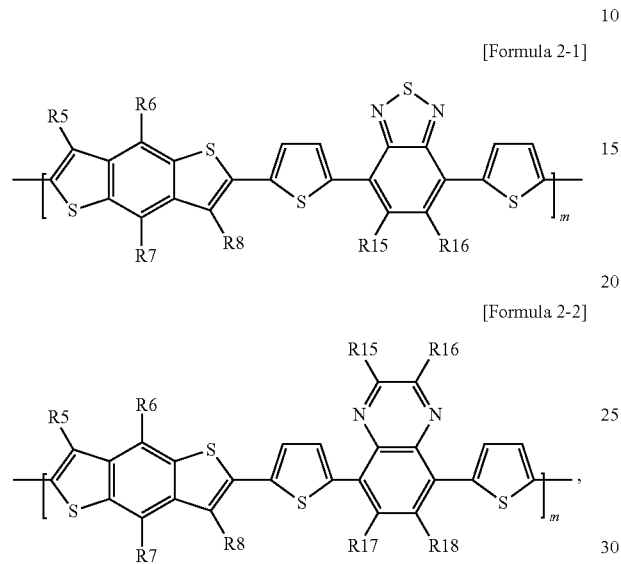

wherein in Formulae 2-1 and 2-2:
m is a real number, which is 0<m<1;
R5 and R8 are the same as or different from each other, and each independently is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group;

R6 and R7 are the same as or different from each other, and each independently is selected from the group consisting of hydrogen; deuterium; a halogen group; a nitrile group; a nitro group; an imide group; an amide group; a hydroxyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; and a substituted or unsubstituted aryl group; and R15 to R18 are the same as or different from each other, and each independently is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; and a substituted or unsubstituted heterocyclic group, or two adjacent substituents are optionally combined with each other to form a ring.

11. The copolymer of claim 10, wherein at least one of R15 to R18 is a substituted or unsubstituted alkyl group having 1 to 40 carbon atoms; a substituted or unsubstituted alkoxy group having 1 to 40 carbon atoms; a substituted or unsubstituted sulfide group having 1 to 40 carbon atoms; or a hydroxyl group.

12. The copolymer of claim 1, wherein the copolymer comprises a copolymer of Formula 3

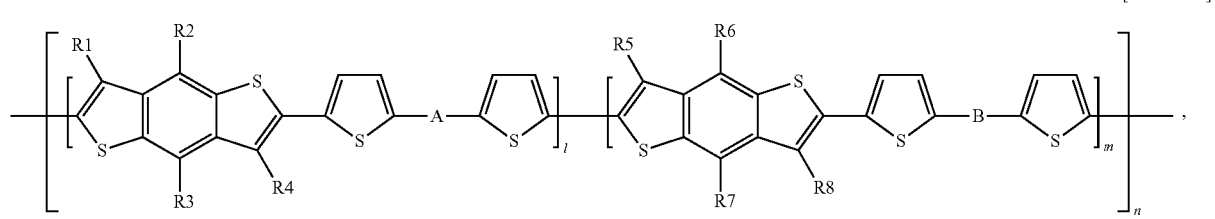

wherein in Formula 3:
l is a real number, which is 0<l<1, as a mole fraction,
m is a real number, which is 0<m<1, as a mole fraction, and
l+m=1;
A and B are different from each other, and each comprises one or more moieties selected from the group consisting of a direct bond; a monocyclic or polycyclic substituted or unsubstituted divalent heterocyclic group; a monocyclic or polycyclic substituted or unsubstituted divalent aromatic cyclic group; and a fused divalent ring in which a monocyclic or polycyclic heterocyclic group and a monocyclic or polycyclic aromatic cyclic group are substituted or unsubstituted;
$R_1$, $R_4$, $R_5$ and $R_8$ are the same as or different from each other, and each independently is selected from the group consisting of hydrogen; deuterium a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group;
$R_2$, $R_3$, $R_6$ and $R_7$ are the same as or different from each other, and each independently is selected from the group consisting of hydrogen; deuterium a halogen group; a nitrile group; a nitro group; an imide group; an amide group; a hydroxyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; and a substituted or unsubstituted aryl group; and
n is an integer of 1 to 10,000.

13. The copolymer of claim 1, wherein a number average molecular weight of the copolymer is 500 g/mol to 1,000,000 g/mol.

14. The copolymer of claim 1, wherein a molecular weight distribution of the copolymer is 1 to 100.

15. An organic solar cell comprising:
a first electrode;
a second electrode provided opposite to the first electrode; and
an organic material layer having one or more layers disposed between the first electrode and the second electrode and comprising a photoactive layer, wherein one or more layers of the organic material layer comprise the copolymer of claim 1.

16. The organic solar cell of claim 15, wherein the organic material layer comprises a hole transport layer, a hole injection layer, or a layer which transports and injects holes simultaneously, and the hole transport layer, the hole injection layer, or the layer which transports and injects holes simultaneously comprise the copolymer.

17. The organic solar cell of claim 15, wherein the organic material layer comprises an electron transport layer, an electron injection layer, or a layer which transports and injects electrons simultaneously, and the electron transport layer, the electron injection layer, or the layer which transports and injects electrons simultaneously comprises the copolymer.

18. The organic solar cell of claim 15, wherein the photoactive layer comprises one or two or more selected from the group consisting of an electron donor and an electron acceptor, and the electron donor comprises the polymer.

19. The organic solar cell of claim 18, wherein the electron acceptor is selected from the group consisting of a fullerene, a fullerene derivative, a carbon nanotube, a carbon nanotube derivative, a bathocuproine, a semiconductor element, a semiconductor compound, and a combination thereof.

20. The organic solar cell of claim 18, wherein the electron donor and the electron acceptor are a bulk heterojunction (BHJ).

* * * * *